(12) United States Patent
Inatomi

(10) Patent No.: US 8,728,247 B2
(45) Date of Patent: May 20, 2014

(54) SUBSTRATE PROCESSING METHOD, STORAGE MEDIUM STORING PROGRAM FOR EXECUTING SUBSTRATE PROCESSING METHOD AND SUBSTRATE PROCESSING APPARATUS

(75) Inventor: Yuichiro Inatomi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 438 days.

(21) Appl. No.: 12/974,092

(22) Filed: Dec. 21, 2010

(65) Prior Publication Data
US 2011/0155181 A1 Jun. 30, 2011

(30) Foreign Application Priority Data

Dec. 25, 2009 (JP) ................................. 2009-295390

(51) Int. Cl.
*B08B 7/00* (2006.01)
*B08B 3/00* (2006.01)
*B08B 7/04* (2006.01)

(52) U.S. Cl.
USPC .................... 134/30; 134/18; 134/26; 134/36; 134/37

(58) Field of Classification Search
USPC .......................... 134/18, 26, 30, 34, 36, 21, 37
See application file for complete search history.

(56) References Cited

U.S. PATENT DOCUMENTS

| | | | | |
|---|---|---|---|---|
| 5,698,037 A | * | 12/1997 | Stauffer ......................... | 118/726 |
| 2002/0148483 A1 | * | 10/2002 | Mertens et al. ................ | 134/1.3 |
| 2006/0269877 A1 | * | 11/2006 | Boyd et al. .................... | 430/326 |
| 2007/0134601 A1 | * | 6/2007 | Naitou et al. ................. | 430/331 |
| 2007/0264594 A1 | * | 11/2007 | Chang et al. .................. | 430/311 |
| 2007/0267047 A1 | | 11/2007 | Hori et al. | |
| 2008/0008973 A1 | * | 1/2008 | Goto et al. .................... | 430/432 |
| 2008/0289656 A1 | * | 11/2008 | Kondoh .......................... | 134/18 |
| 2009/0042149 A1 | * | 2/2009 | Naitou et al. ................. | 430/331 |
| 2010/0075504 A1 | * | 3/2010 | Tomita et al. ................. | 438/706 |
| 2010/0099256 A1 | * | 4/2010 | Asako et al. .................. | 438/675 |
| 2010/0330283 A1 | * | 12/2010 | Nakamori et al. ............ | 427/299 |

FOREIGN PATENT DOCUMENTS

| | | |
|---|---|---|
| CN | 101075553 A | 11/2007 |
| JP | 2003-109897 A | 4/2003 |
| JP | 2003-178943 A | 6/2003 |
| JP | 2008-016780 A | 1/2008 |

OTHER PUBLICATIONS

Japanese Office action for 2009-295390 dated Nov. 29, 2011.

\* cited by examiner

*Primary Examiner* — Alexander Markoff
(74) *Attorney, Agent, or Firm* — Pearne & Gordon LLP

(57) ABSTRACT

There is provided a substrate processing method capable of preventing pattern collapse when a rinse solution is removed from a substrate on which a microscopic resist pattern is formed and also capable of reducing cost for processing the substrate by decreasing an amount of usage of a hydrophobicizing agent. The substrate processing method includes a rinse solution supply process (step S12) for supplying the rinse solution onto the substrate on which the resist pattern is formed; and a rinse solution removing process (steps S14 to S16) for removing the rinse solution from the substrate in an atmosphere including vapor of a first processing solution that hydrophobicizes the resist pattern.

6 Claims, 28 Drawing Sheets

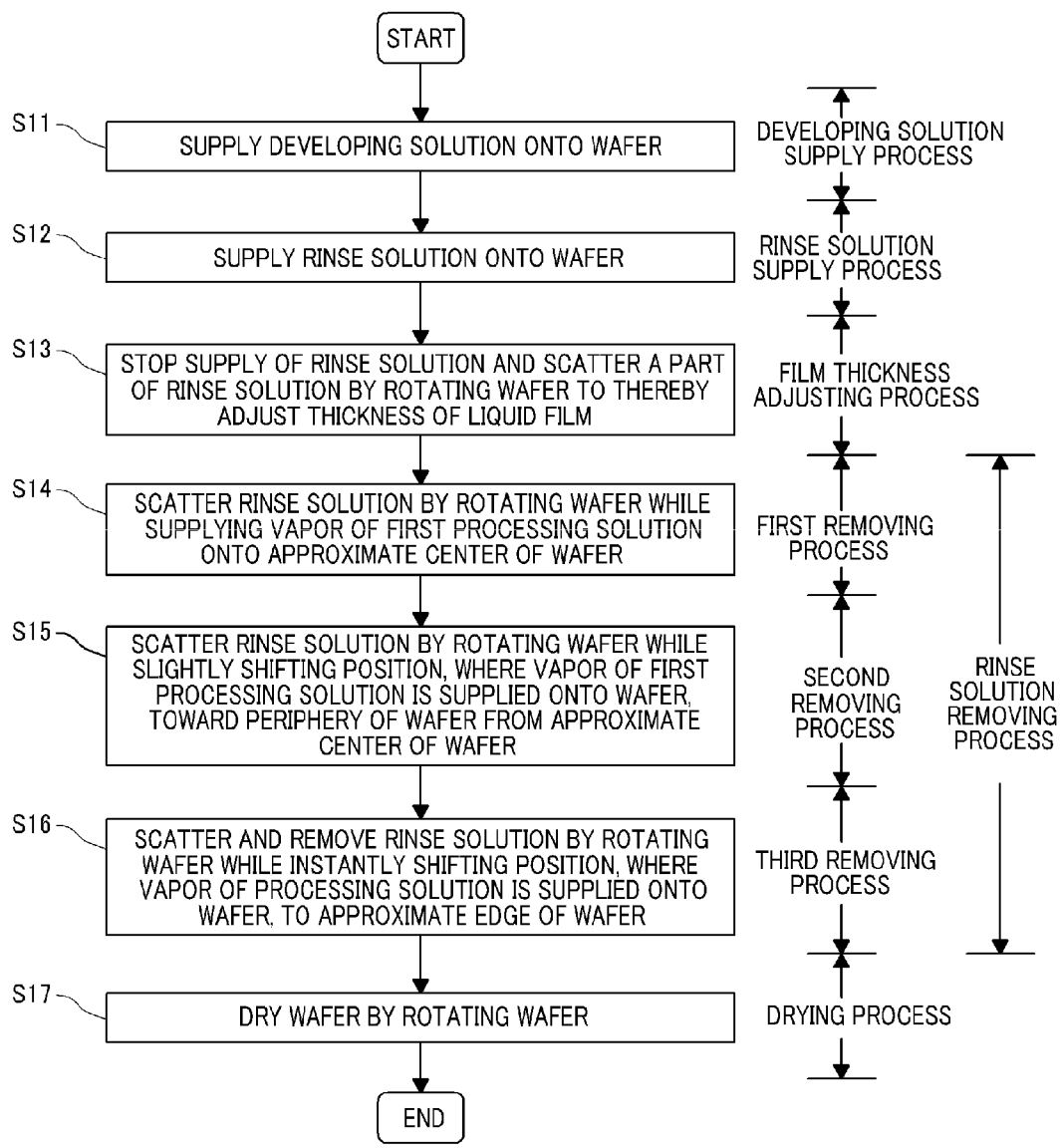

SUBSTRATE PROCESSING METHOD, STORAGE MEDIUM STORING PROGRAM FOR EXECUTING SUBSTRATE PROCESSING METHOD AND SUBSTRATE PROCESSING APPARATUS

CROSS-REFERENCE TO RELATED APPLICATION

This application claims the benefit of Japanese Patent Application No. 2009-295390 filed on Dec. 25, 2009, the entire disclosures of which are incorporated herein by reference.

FIELD OF THE INVENTION

The present disclosure relates to a substrate processing method for processing a substrate by using a processing solution, a storage medium storing a program for executing the substrate processing method and a substrate processing apparatus for performing the substrate processing method.

BACKGROUND OF THE INVENTION

In a photolithography process for manufacturing a semiconductor device, photoresist is coated on a surface of a semiconductor substrate (hereinafter, simply referred to as a "substrate" or a "wafer"), and a mask pattern is exposed on the photoresist and then is developed, so that a resist pattern is formed on the surface of the wafer.

In such a photolithography process, a developing process may be performed by, e.g., a puddle method or a dipping method. By way of example, in the puddle method, the developing process is performed by supplying a developing solution to the wafer, whereas in the dipping method, the developing process is performed by submerging the wafer in the developing solution. Then, in both methods, a rinse solution such as pure water which is used as a cleaning solution is supplied to the wafer to wash away the developing solution. Thereafter, to remove the rinse solution from the wafer, a drying process is performed by blowing air to the wafer or by rotating the wafer.

Meanwhile, along with the recent trend for higher degree of miniaturization of semiconductor devices, resist patterns are getting finer and becoming to have a higher aspect ratio. Since such resist patterns are microscopic and have a high aspect ratio, when the rinse solution is removed from between the patterns during the drying process, an attraction force may be generated between the patterns due to a surface tension of the rinse solution, thereby resulting in a so-called "pattern collapse". In order to prevent the pattern collapse, there has been proposed a developing method for supplying, onto a substrate, an organic solvent having a smaller surface tension than that of the rinse solution before the drying process is performed.

By way of example, in order to prevent pattern collapse in the process of removing a rinse solution, there has been proposed a developing method for supplying a rinse solution to a substrate having a developed resist pattern and supplying a fluorine-containing organic solvent to the substrate onto which the rinse solution has been supplied (see, for example, Patent Document 1).

Patent Document 1: Japanese Patent Laid-open Publication No. 2003-178943

However, when a processing solution containing the organic solvent is supplied to the substrate onto which the rinse solution has been supplied, the following problems may be caused.

As a next-generation exposure technology, EUV (Extreme Ultra-Violet) exposure is under development, and further miniaturization of a resist pattern is progressing. Besides, when an etching is performed using the miniaturized resist pattern as a mask to transfer the resist pattern onto an etching target film under the resist pattern, there may be a case in which a height of a resist pattern is increased depending on etching conditions. If the height of the resist pattern increases, an aspect ratio with respect to a width of the resist pattern may also be increased. Such an increase of the aspect ratio of the resist pattern may cause pattern collapse depending on a relationship between a surface tension of pure water and a contact angle of the pure water with respect to the resist pattern, when the water is removed from the resist pattern during the drying process after the developing process and the rinse process.

It has been attempted to prevent pattern collapse by hydrophobicizing a surface of a resist pattern through the use of a hydrophobicizing agent instead of the processing solution including the fluorine-containing organic solvent. Since, however, the hydrophobicizing solution is a high-price liquid chemical, cost for processing the substrate may be increased.

Furthermore, the pattern collapse may occur not only in the developing process but also in various subsequence substrate processes performed after the resist pattern is developed. For example, the pattern collapse may occur in a cleaning process for cleaning the substrate on which the resist pattern is formed.

BRIEF SUMMARY OF THE INVENTION

In view of the foregoing, the present disclosure provides a substrate processing method capable of preventing pattern collapse when a rinse solution is removed from a substrate on which a microscopic resist pattern is formed and also capable of reducing cost for processing the substrate by decreasing an amount of usage of a hydrophobicizing agent.

To solve the aforementioned problems, the following means have been devised in accordance with the present disclosure.

In accordance with one aspect of the present disclosure, there is provided a substrate processing method including: a rinse solution supply process for supplying a rinse solution onto a substrate on which a resist pattern is formed; and a rinse solution removing process for removing the rinse solution from the substrate in an atmosphere including vapor of a first processing solution that hydrophobicizes the resist pattern.

In accordance with another aspect of the present disclosure, there is provided a substrate processing apparatus including: a substrate holder that holds a substrate on which a resist pattern is formed; a rinse solution supply unit that supplies a rinse solution onto the substrate held by the substrate holder; a vapor supply unit that supplies vapor of a first processing solution, which hydrophobicizes the resist pattern, onto the substrate on which the rinse solution is supplied from the rinse solution supply unit; and a rinse solution removing unit that removes the rinse solution from the substrate in an atmosphere including the vapor of the first processing solution supplied from the vapor supply unit.

In accordance with the present disclosure, pattern collapse can be prevented when a rinse solution is removed from a substrate on which a microscopic resist pattern is formed, and cost for processing the substrate can be reduced by decreasing an amount of usage of a hydrophobicizing agent.

BRIEF DESCRIPTION OF THE DRAWINGS

Non-limiting and non-exhaustive embodiments will be described in conjunction with the accompanying drawings.

Understanding that these drawings depict only several embodiments in accordance with the disclosure and are, therefore, not to be intended to limit its scope, the disclosure will be described with specificity and detail through use of the accompanying drawings, in which:

FIG. 7 provides a flowchart for describing a process sequence of a developing method using the developing unit;

DETAILED DESCRIPTION OF THE INVENTION

Hereinafter, embodiments of the present disclosure will be described with reference to the accompanying drawings.

First Embodiment

Referring to FIGS. 1 to 13, a developing apparatus and a developing method in accordance with a first embodiment of the present disclosure will be explained. The developing apparatus and the developing method in accordance with the first embodiment are related to examples in which a substrate processing apparatus and a substrate processing method in accordance with the present disclosure are applied to a developing apparatus and a developing method, respectively.

Figure 1:
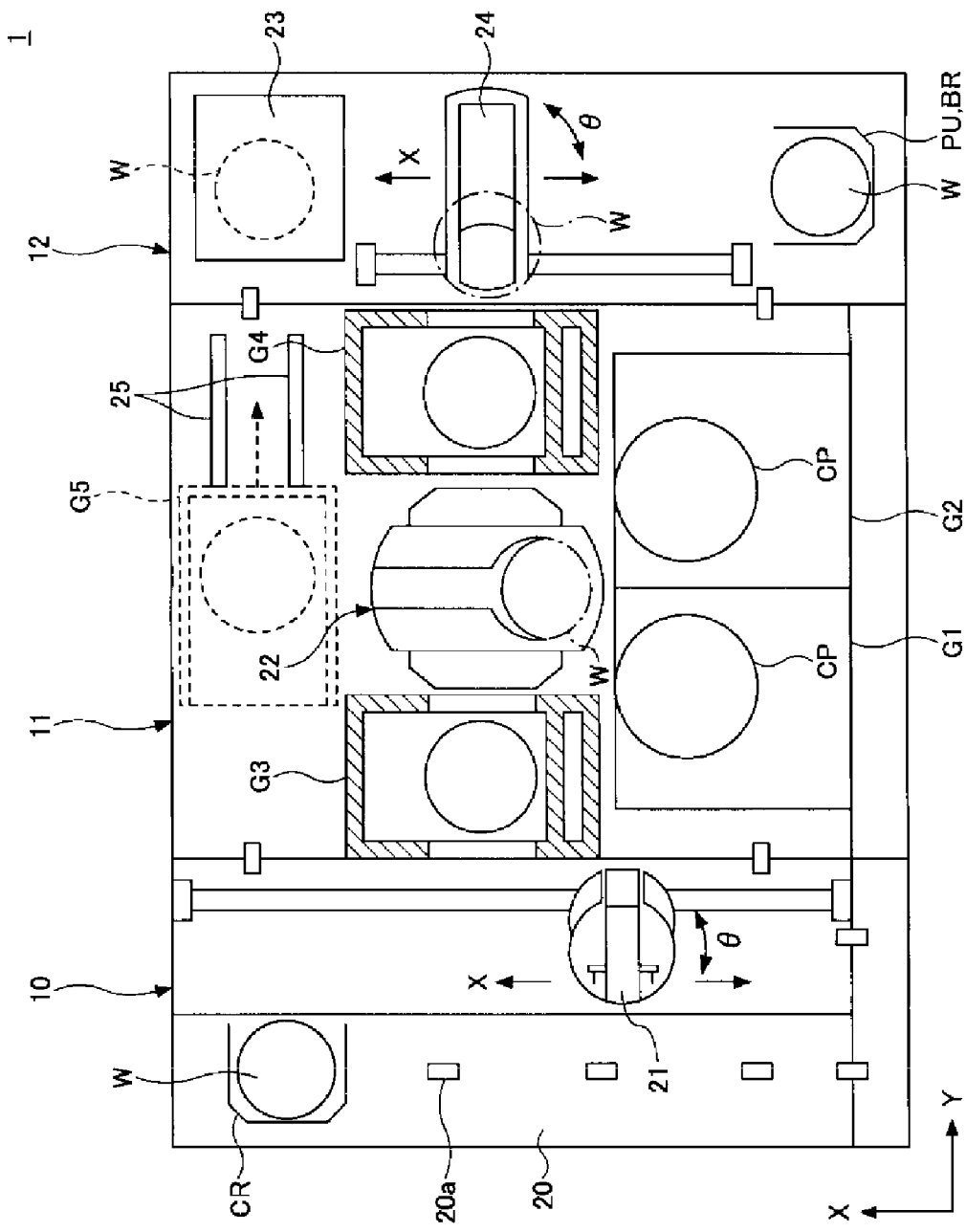
FIG. 1 is a plane view of a coating and developing system including a developing apparatus in accordance with a first embodiment of the present disclosure.
Figure 2:
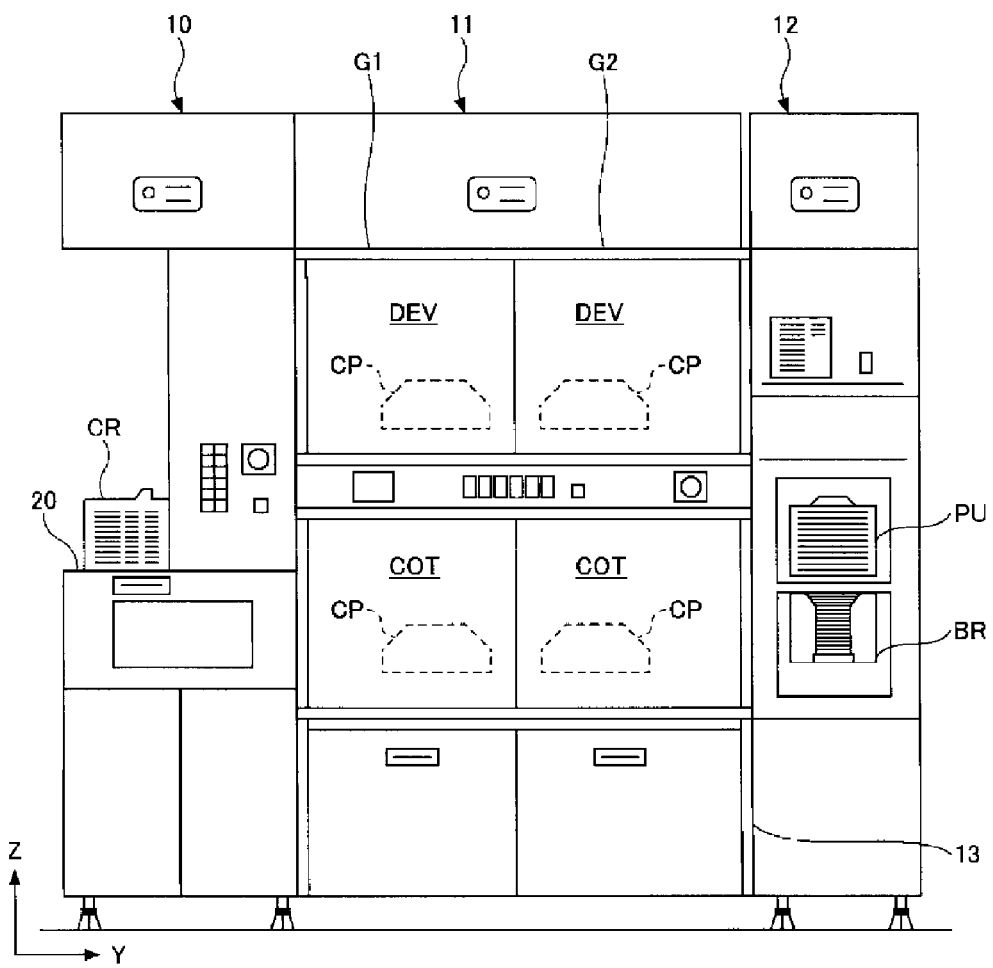
FIG. 2 is a front view of the coating and developing system shown in FIG. 1.
Figure 3:
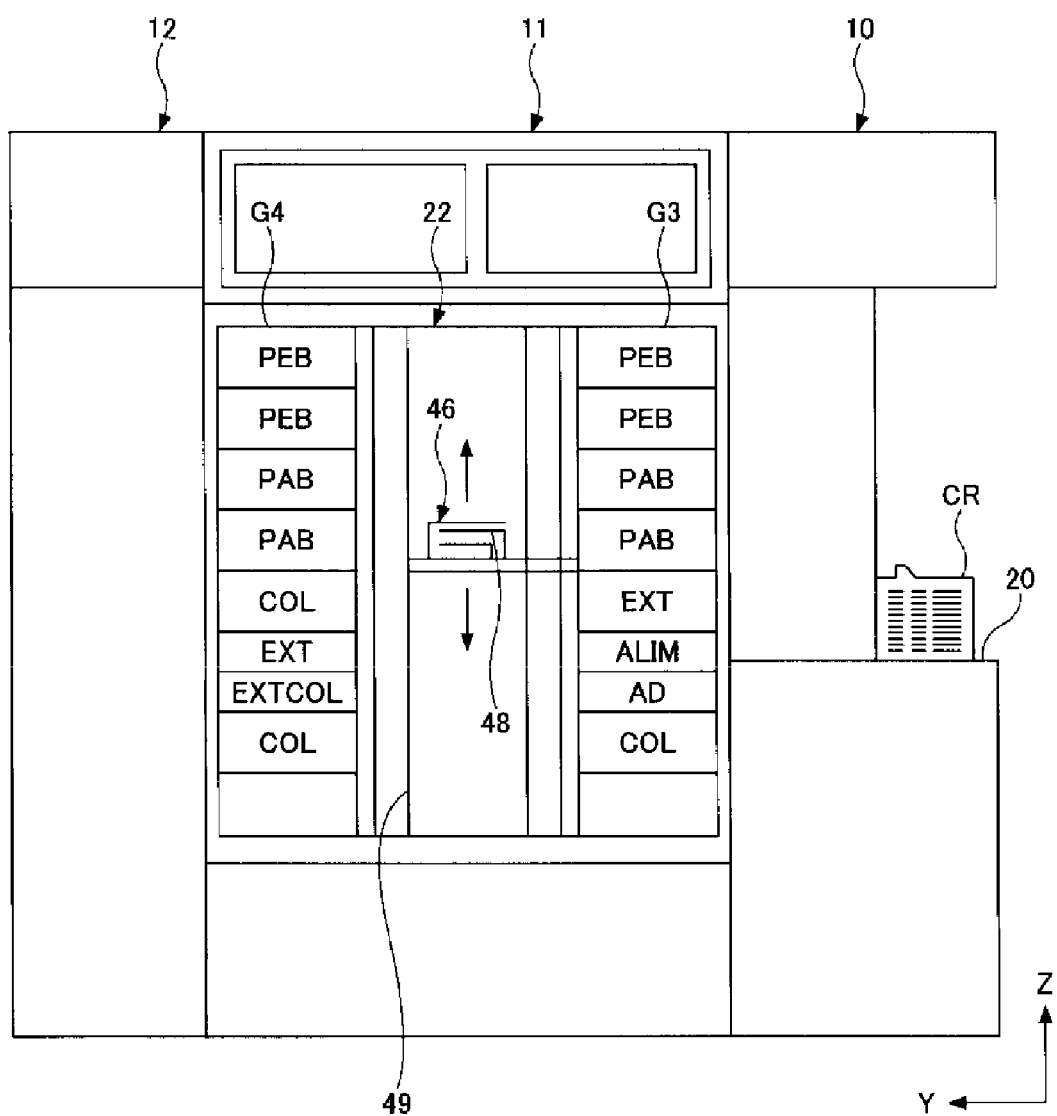
FIG. 3 is a rear view of the coating and developing system shown in FIG. 1.

FIGS. 1 to 3 are diagrams illustrating an entire configuration of a coating and developing system including the developing apparatus in accordance with the first embodiment. FIGS. 1 to 3 are a plane view, a front view and a rear view thereof, respectively.

The coating and developing system 1 includes a cassette station 10, a processing station 11 and an interface section 12 connected as one body. The cassette station 10 loads a plurality of, e.g., 25 sheets of semiconductor wafers W as processing target substrates into a wafer cassette CR of the coating and developing system from the outside and the cassette station 10 unloads them from the wafer cassette CR to the outside. Further, the cassette station 10 also loads and unloads the wafers W into and from the wafer cassette CR. In the processing station 11, various processing units for performing single-wafer processes during a coating and developing process are arranged at preset positions in multi levels. The interface section 14 transfers the wafers W between the processing station 11 and an exposure apparatus (not shown) adjacent to the processing station 11.

As shown in FIG. 1, the cassette station 10 may include a cassette mounting table 20 and a wafer transfer device 21. A plurality of, e.g., four wafer cassettes CR may be arranged at positions of protrusions 20a on the cassette mounting table 20 in a row in an X direction such that their respective wafer loading/unloading openings face the processing station 11. The wafer transfer device 21 is configured to be movable in a cassette arrangement direction (X direction) and also movable in an arrangement direction (Z direction) of the wafers accommodated in the wafer cassette CR. The wafer transfer device 21 is capable of selectively accessing the respective wafer cassettes CR. Further, the wafer transfer device 21 is rotatable in a θ direction and is also capable of accessing an alignment unit ALIM and an extension unit EXT included in a third unit set G3 of the processing station 12 to be described later.

As depicted in FIG. 1, a main wafer transfer mechanism 22 movable in a vertical direction is provided in a central portion of the processing station 11, and a single set or multiple sets of processing units are all arranged around the main wafer transfer mechanism 22 in multi levels. In the present embodiment, five unit sets G1 to G5 are arranged in multi levels. Multi-level units of the first unit set G1 and the second unit set G2 are arranged on the front side of the coating and developing system (front side of FIG. 1). Multi-level units of the third unit set G3 are arranged adjacent to the cassette station 10, while multi-level units of the fourth unit set G4 are arranged adjacent to the interface section 12. Further, multi-level units of the fifth unit set G5 are arranged on the rear side of the coating and developing system. The fifth unit set G5 is configured to be movable along rails 25 for the maintenance of the main wafer transfer mechanism 22.

As depicted in FIG. 3, the main wafer transfer mechanism 22 may include a wafer transfer device 46 that is configured to be movable up and down in a vertical direction (Z direction). A cylindrical support 49 is connected with a rotation shaft of a motor (not shown). The cylindrical support 49 is made to rotate as one body with the wafer transfer device 46 about the rotation shaft by a rotational driving force of the motor. Accordingly, the wafer transfer device 46 is rotatable in a θ direction. The wafer transfer device 46 may include a transfer arm 48.

As shown in FIG. 2, in the first unit set G1, two spinner type processing units for processing wafers W mounted on spin chucks within cups CP, e.g., a resist coating unit COT and a developing unit DEV in accordance with the first embodiment are stacked in two levels in sequence from the bottom. In the second unit set G2, two spinner type processing units, e.g., a resist coating unit COT and a developing unit DEV are stacked in two levels in sequence from the bottom. Since discharge of a resist solution and maintenance thereof is mechanically troublesome in the resist coating unit COT, it may be desirable to place the resist coating unit COT in a lower level. However, if necessary, the resist coating unit COT may be positioned in an upper level.

Further, in an empty space below the first unit set G1 and the second unit set G2 in the Z direction, a chemical container 13 for supplying various processing solutions into the resist coating units COT and the developing units DEV may be provided.

As illustrated in FIG. 3, in the third unit set G3, oven type processing units for performing preset processes on wafers W mounted on mounting tables, e.g., a cooling unit COL, an adhesion unit AD, an alignment unit ALIM, an extension unit EXT, prebaking units PAB and post exposure baking units PEB are stacked in sequence from the bottom. Further, in the fourth unit set G4, oven type processing units, e.g., a cooling unit COL, an extension/cooling unit EXTCOL, an extension unit EXT, a cooling unit COL, prebaking units PAB and post exposure baking units PEB are stacked in sequence from the bottom. Further, a post baking unit for heating the wafers W after a developing process may be provided.

In the above-described configuration, the cooling units COL and the extension/cooling unit EXTCOL having low processing temperatures are arranged in lower levels, while the prebaking units PAB and the post exposure baking units PEB having high processing temperatures are arranged in upper levels. With this vertical arrangement, thermal interference between the units can be reduced. However, these units may be randomly arranged in multi levels.

The interface section 12 may have the same size as that of the processing station 11 in a depth direction but may have a smaller size than that of the processing station 11 in a widthwise direction. A portable pickup cassette PU and a stationary buffer cassette BR are arranged in two levels on the front side of the interface section 12, and a peripheral exposure device 23 is provided on the rear side of the interface section 12. Further, a wafer transfer device 24 is installed in a central portion of the interface section 12. The wafer transfer device 24 is movable in X and Z directions and is capable of accessing the two cassettes PU and BR and the peripheral exposure device 23. Further, the wafer transfer device 24 is rotatable in a θ direction and is capable of accessing the extension unit EXT of the fourth unit set G4 in the processing station 11 as well as a wafer transfer table (not shown) of the exposure apparatus (not shown) adjacent to the interface section 12.

Figure 4:
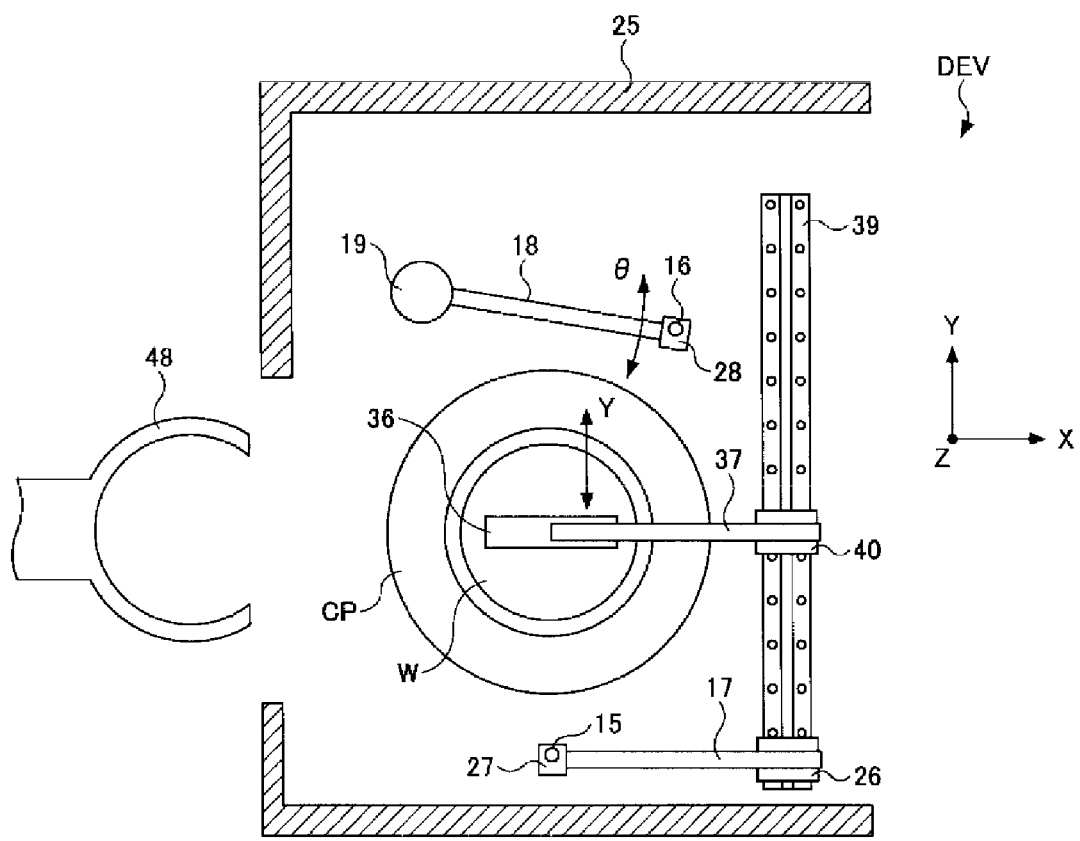
FIG. 4 is a plane view of a developing unit in accordance with the first embodiment.
Figure 5:
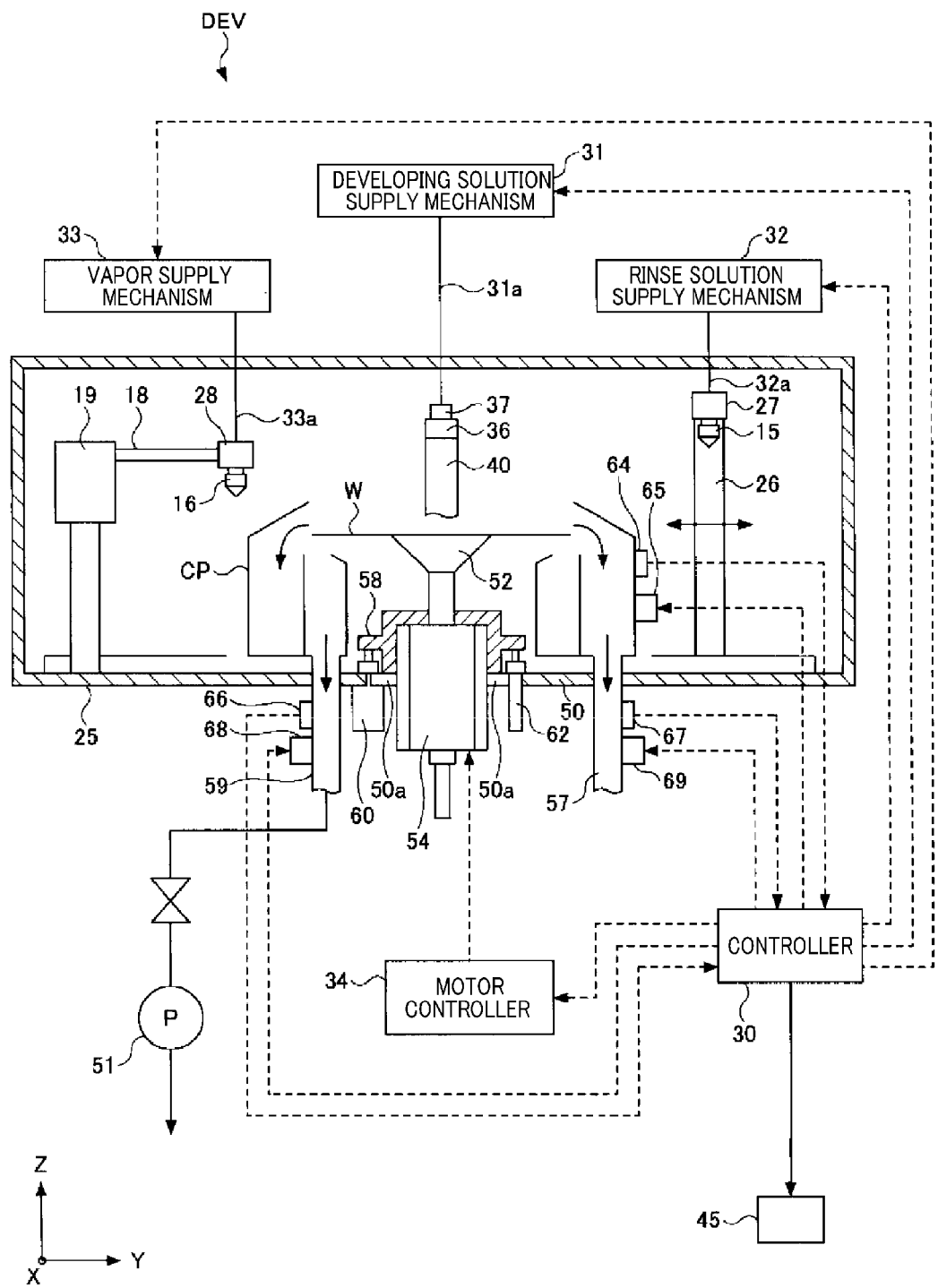
FIG. 5 is a cross sectional view of the developing unit shown in FIG. 4.

FIGS. 4 and 5 are a plane view and a cross sectional view of a developing unit in accordance with the first embodiment. In a central portion of a developing unit DEV, an annular cup CP is provided within a processing chamber 25 of which atmosphere is capable of being controlled to be different from an external atmosphere. In order to prevent leakage of vapor of a first processing solution to the outside, as will be described later, the inside of the processing chamber 25 may be adjustable to a negative pressure. Further, the cup CP is configured to allow the transfer arm 48 of the wafer transfer device 46 to be moved back and forth. A spin chuck 52 for horizontally holding the wafer W thereon is provided within the cup CP. The spin chuck 52 is rotated by driving motor 54 while the wafer W is held on the spin chunk 52 by vacuum attraction. The driving motor 54 is provided in an opening 50a formed in a unit bottom plate 50 so as to be movable up and down and is coupled to an elevation driving unit 60 composed of an air cylinder and an elevation guiding unit 62 via a cap-shaped flange 58 made of aluminum. By this elevating mechanism, the wafer W can be transferred from and to the main wafer transfer mechanism 22.

Further, the spin chuck 52 serves as a substrate holder in accordance with the present disclosure, and the driving motor 54 serves as a rotating unit and a rinse solution removing unit in accordance with the present disclosure.

As illustrated in FIG. 5, a developing solution nozzle 36 for supplying a developing solution onto a surface of the wafer W accommodated in the cup CP from above the wafer W is fixed at a leading end of a nozzle scan arm 37. A supply pipe 31a is connected with the developing solution nozzle 36, and the developing solution is supplied through the supply pipe 31a by a developing solution supply mechanism 31. The developing solution nozzle 36 has an elongated shape and is provided with, e.g., a multiple number of hole-shaped or slit-shaped supply openings through which the developing solution is supplied. The nozzle scan arm 37 is fixed at an upper end of a vertical supporting member 40 which is configured to be horizontally movable in one direction (Y direction) on a guide rail 38 installed on the unit bottom plate 40. The nozzle scan arm 37 is configured to be movable in a Y direction as one body with the vertical supporting member 40 by a non-illustrated Y-direction driving mechanism. Furthermore, the nozzle scan arm 37 is also configured to be movable in a Z direction along the vertical support member 40, so that a distance between the developing solution nozzle 36 and the wafer W held on the spin chuck 52 can be adjusted.

Further, a rinse nozzle 15, held by a nozzle holder 27, for supplying a rinse solution onto the surface of the wafer W is installed so as to be movable in the Y direction along the guide rail 38 by a nozzle scan arm 17 and a vertical supporting member 26, as in the case of the developing solution nozzle

36. A supply pipe 32*a* is connected with the rinse nozzle 15, and the rinse solution is supplied from a rinse solution supply mechanism 32 through the supply pipe 32*a*. Here, the rinse solution may be, for example, pure water. The nozzle scan arm 17 is also configured to be movable along the vertical supporting member 26, so that a distance between the rinse nozzle 15 and the wafer W held on the spin chuck 52 can be adjusted.

Further, the rinse nozzle 15 serves as a rinse solution supply unit in accordance with the present disclosure.

Adjacent to the cup CP, a vapor supply nozzle 16, held by a nozzle holder 28, is fixed at a leading end of a nozzle scan arm 18, and the vapor supply nozzle 16 supplies vapor of a first processing solution including a hydrophobicizing agent for hydrophobicizing a surface of a resist pattern 29 on the wafer W. The nozzle scan arm 18 is rotatable about a motor 19 in a θ direction by being driven by the motor 19. A supply pipe 33*a* is connected with the vapor supply nozzle 16, and the vapor of the first processing solution is supplied from a vapor supply mechanism 33 through the supply pipe 33*a*.

Further, the vapor supply nozzle 16 and the motor 19 serves as a vapor supply unit and a moving unit in accordance with the present disclosure, respectively.

A liquid drain pipe 57 for draining the developing solution and the rinse solution supplied onto the wafer is provided in a bottom of the cup CP, and the developing solution and the rinse solution are drained to the non-illustrated outside of the system. Further, also installed in the bottom of the cup CP is a gas exhaust pipe 59 for exhausting an atmosphere within the cup CP such as mist generated by the supply of the developing solution or the processing solution. Typically, during the operation, the atmosphere within the cup CP continues to be exhausted by a vacuum pump 51.

Moreover, a temperature sensor 64 for measuring a temperature of the cup CP and a temperature control heater for controlling the temperature of the cup CP are installed at the cup CP. Usually, the temperature control heater 65 controls the temperature of the entire cup CP to be a preset value, e.g., about 23° C. or thereabout.

In the same way, a temperature sensor 66 for measuring a temperature of the gas exhaust pipe 59 and a temperature control heater 68 for controlling the temperature of the gas exhaust pipe 59 are installed at the gas exhaust pipe 59, and a temperature sensor 67 for measuring a temperature of the liquid drain pipe 57 and a temperature control heater 69 for controlling the temperature of the liquid drain pipe 57 are installed at the liquid drain pipe 57.

The developing solution supply mechanism 31, the rinse solution supply mechanism 32 and the vapor supply mechanism 33 supply the developing solution, the rinse solution and the vapor of the first processing solution to the developing solution nozzle 36, the rinse nozzle 15 and the vapor supply nozzle 16, respectively, in response to instructions of a controller 30. Further, the controller 30 controls timing for the supply of the developing solution, the rinse solution and the vapor of the first processing solution and sends an instruction to a motor controller 34 for controlling a rotation speed of the driving motor 54 to thereby control an overall process of the developing unit.

The controller 30 may have a non-illustrated storage composed of a computer readable storage medium (recording medium) that stores a program for executing each process of a developing method in the coating and developing system. The storage medium may be a hard disk or a semiconductor memory. Alternatively, a control program may be appropriately transmitted from another apparatus through, e.g., a dedicated line.

Further, by way of example, when the temperatures of the cup CP, the gas exhaust pipe 59 and the liquid drain pipe 57 respectively measured by the temperature sensors 64, and 67 fall out of preset ranges, the controller 30 determines that abnormality has occurred, and controls an alarm device 45 to give an alarm based on the abnormality determination. The alarm device 45 may be, but not limited to, a buzzer, an alarm lamp, an alarm mark on a manipulation display, or the like.

Now, a series of processes performed by the above-described coating and developing system 1 will be explained.

First, in the cassette station 10, the wafer transfer device 21 accesses the wafer cassette CR, in which unprocessed wafers W are accommodated, on the cassette mounting table 20 and takes out one of the unprocessed wafers W from the wafer cassette CR. The wafer W taken from the wafer cassette CR is then transferred into the alignment unit ALIM, and position alignment of the wafer W is performed by the alignment unit ALIM. Thereafter, by the main wafer transfer mechanism 22, the wafer W is transferred into the adhesion unit AD for performing a hydrophobicizing process and then is transferred into the cooling unit COL for performing a cooling process. Afterward, the wafer W is transferred into the resist coating unit COT for performing a resist coating process; the wafer W is transferred into the prebaking unit PAB for performing a heating process; and then the wafer W is transferred into the cooling unit COL for performing a cooling process. Thereafter, the wafer W is transferred by the wafer transfer device 24 into the non-illustrated exposure apparatus via the interface section 12, and an exposure process is performed in the exposure apparatus. After the exposure process of the wafer W is completed, the wafer W is transferred into the post exposure baking unit PEB for performing a heating process and then is transferred into the cooling unit COL for performing a cooling process. Subsequently, the wafer W is transferred into the developing unit DEV, and a developing process is performed by the developing unit DEV. After the developing process is finished, a heating process (post baking) may be performed. Then, the wafer W is transferred into the cooling unit COL, and a cooling process is performed by the cooling unit COL and the wafer W is then returned back into the wafer cassette CR by the extension unit EXT.

Figure 6:
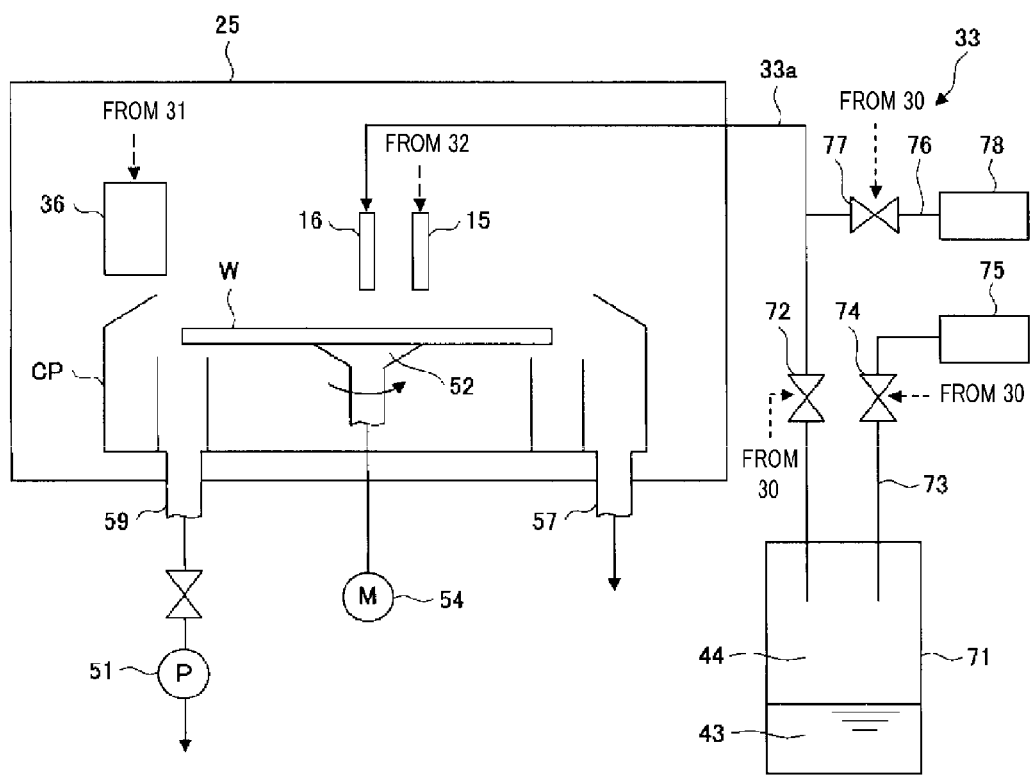
FIG. 6 is a diagram schematically illustrating major parts of the developing unit in accordance with the first embodiment.

FIG. 6 is a diagram schematically illustrating major parts of the developing unit in accordance with the embodiment of the present disclosure. Further, in FIG. 6, elaboration of parts already described in FIGS. 4 and 5 will be omitted.

Further, FIG. 6 schematically illustrates positions of the respective nozzles when a rinse solution removing process is performed after the completion of a developing solution supply process and a rinse solution supply process to be described later with reference to FIG. 7. That is, the developing solution nozzle 36 is located outside the cup CP, and the rinse nozzle 15 is located at a position slightly deviated from an approximate center of the wafer W toward a periphery of the wafer W. The vapor supply nozzle 16 is placed at a position above the approximate center of the wafer W.

The vapor supply mechanism 33 includes a vapor generating tank 71 that generates vapor 44 by vaporizing a first processing solution 43 including a hydrophobicizing agent. The vapor generating tank 71 stores the first processing solution 43 therein. The vapor generating tank 71 is connected with one end of the supply pipe 33*a* for supplying the vapor 44 of the first processing solution. As stated above, the other end of the supply pipe 33*a* is connected with the vapor supply nozzle 16 via a valve 72 configured to be opened and closed by the controller 30.

Connected to the vapor generating tank 71 is one end of a carrier gas supply pipe 73 for supplying a carrier gas such as a N₂ gas. The other end of the carrier gas supply pipe 73 is connected with a carrier gas supply source 75 via a valve 74 configured to be opened and closed by the controller 30. As the carrier gas supplied into the vapor generating tank 71 from the carrier gas supply source 75 pressurizes the inside of the vapor generating tank 71, the vapor 44 generated in the vapor generating tank 71 is supplied into the vapor supply nozzle 16 through the supply pipe 33a. If the first processing solution 43 includes TMSDMA as will be described later, the first processing solution 43 may readily react with moisture in the atmosphere. For this reason, by using the carrier gas such as the N₂ gas, the first processing solution 43 and the vapor 44 of the first processing solution may be prevented from reacting with the moisture in the atmosphere.

Furthermore, on a part of the supply pipe 33a, the supply pipe 33a is connected with one end of a dilution gas supply pipe 76 for supplying a dilution gas such as a N₂ gas. The other end of the dilution gas supply pipe 76 is connected with a dilution gas supply source 78 via a valve 77 configured to be opened and closed by the controller 30.

In the vapor supply mechanism 33 configured as described above, the valve 74 is opened under the control of the controller 30, and the carrier gas is supplied from the carrier gas supply source 75 into the vapor generating tank 71 through the carrier gas supply pipe 73 at a certain flow rate. Then, the valve 72 is opened, and the vapor 44 of the first processing solution vaporized within the vapor generating tank 71 is supplied into the vapor supply nozzle 16 through the supply pipe 33a along with the carrier gas. Here, the vapor 44 of the first processing solution may be supplied into the vapor supply nozzle 16 after the vapor 44 is diluted with the dilution gas introduced into the supply pipe 33a from the dilution gas supply source 78 via the valve 77 and the dilution gas supply pipe 76. On the contrary, in order to stop the supply of the vapor 44 of the first processing solution into the vapor supply nozzle 16, the valve 72 of the supply pipe 33a and the valve 77 of the dilution gas supply pipe 76 are closed, and the valve 74 is also closed to thereby stop the supply of the carrier gas from the carrier gas supply source 75.

In addition, a non-illustrated supply source for continuously supplying the first processing solution 43 including the hydrophobicizing agent may be connected with the vapor generating tank 71 via a non-illustrated supply pipe. Further, it may also be possible to install a non-illustrated liquid surface sensor that detects a maximum and minimum height of a surface of the stored first processing solution 43 and sends a detection signal to the controller 30.

Here, the hydrophobicizing agent that hydrophobicizes the resist pattern may not be particularly limited. By way of example, a molecular compound having a silyl group of $(CH_3)_3Si$ may be used as the hydrophobicizing agent. One example of such a silyl group may be TMSDMA (Trimethylsilyldimethylamine).

Furthermore, in the present embodiment, a mixture of a hydrophobicizing agent and an organic solvent for diluting the hydrophobicizing agent may be used as the first processing solution instead of the hydrophobicizing agent itself. A fluorine-containing organic solvent for diluting the hydrophobicizing agent may be, but not limited to, a hydrofluoroether (HFE)-based solvent (methylperfluoroisobutylether, methylperfluorobutylether, or a mixture thereof) having higher volatility than pure water. Further, xylene, hexamethyldisilazane or the like may also be used. The HFE-based solvent does not dissolve a resist and thus can be supplied onto the resist.

Further, the vapor generating tank 71 may include a temperature controller composed of, e.g., a heating device such as a heater or a cooling device such as a Peltier element capable of controlling an internal temperature of the vapor generating tank 71 so as to generate an optimum amount of vapor 44 depending on the hydrophobicizing agent included in the first processing solution 43. When TMSDMA or TMSDMA diluted with HFE is used as the hydrophobicizing agent, the temperature controller may control the internal temperature of the vapor generating tank 71 to be substantially the same as a room temperature.

Now, referring to FIGS. 7 to 11, a developing method using the developing unit will be described. FIG. 7 is a flowchart for describing a process sequence, and FIGS. 8 to 11A are side views for illustrating respective processes.

As depicted in FIG. 7, the developing method in accordance with the present embodiment may include a developing solution supply process (step S11), a rinse solution supply process (step S12), a film thickness adjusting process (step S13), a rinse solution removing process (steps S14 to S16) and a drying process (step S17). The rinse solution removing process may include a first removing process (step S14), a second removing process (step S15) and a third removing process (step S16).

Furthermore, example processing recipes for the developing method shown in FIG. 7 are specified in Table 1.

TABLE 1

| Step No. | Process name | Time (sec) | Rotation speed (rpm) | Nozzle position (mm) with respect to substrate center | Liquid chemical |
|---|---|---|---|---|---|
| S12 | Rinse solution supply process | 2~15 | 0~1200 | 0 | Rinse solution |
| S13 | Film thickness adjusting process | 3 | 1000 | — | — |
| S14 | 1$^{st}$ removing process | 3 | 1000 | 0 | Vapor of first processing solution |
| S15 | 2$^{nd}$ removing process | 3 | 100 | 25 | Vapor of first processing solution |
| S16 | 3$^{rd}$ removing process | 1 | 1000 | 150 | Vapor of first processing solution |
| S17 | Drying process | 15 | 2000 | — | — |

From the left of Table 1, columns represent a step number, a process name, time, a rotation speed (rpm), a nozzle position (mm) with respect to a substrate center and a kind of a liquid chemical supplied in each step in sequence. Further, the nozzle position (mm) with respect to the substrate center indicates a position when a wafer having a diameter of about 12 inches is processed.

First, the developing solution supply process (step S11) is performed. In this developing solution supply process (step S11), a developing solution 41 is supplied onto the wafer W, and a resist pattern 29 is developed.

Figure 8A:
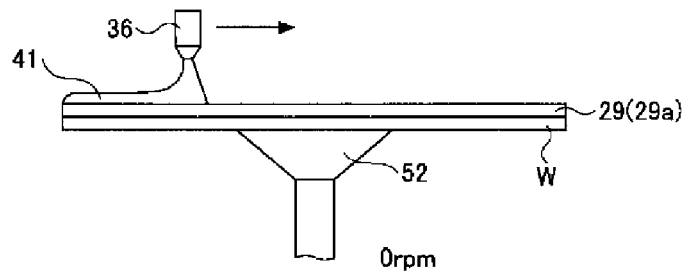
FIGS. 8A to 8D are first side views for illustrating respective processes of the developing method using the developing unit.

The spin chuck 52 is elevated upward and receives the wafer W from the main wafer transfer mechanism 22. Then, the spin chuck 51 is lowered, and the wafer W having the resist pattern 29 formed thereon is accommodated in the cup CP. Thereafter, as illustrated in FIG. 8A, the developing solution nozzle 36 is moved over the wafer W while supplying the developing solution 41 onto the wafer W. After the supply of the developing solution 41 is completed, the wafer W is left in that state for, e.g., about 60 seconds, so that the developing process progresses. Here, in order to achieve high throughput, the developing solution 41 may be supplied while the wafer W is being rotated. In such a case, the developing solution 41 may be diffused by rotating the wafer W at a preset rotation speed. Then, the wafer W is maintained in that state for, e.g., about 60 seconds, so that the developing process progresses.

Subsequently, the rinse solution supply process (step S12) is carried out. In the rinse solution supply process (step S12), a rinse solution 42 is supplied onto the wafer W of which the resist pattern 29 is developed, so that the developing solution 41 is removed from the wafer W.

Figure 8B:
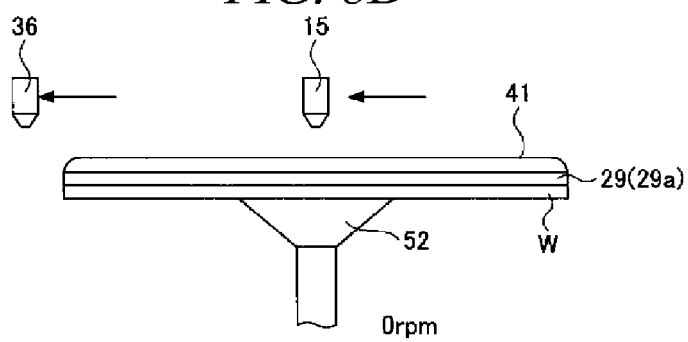
Figure 8C:
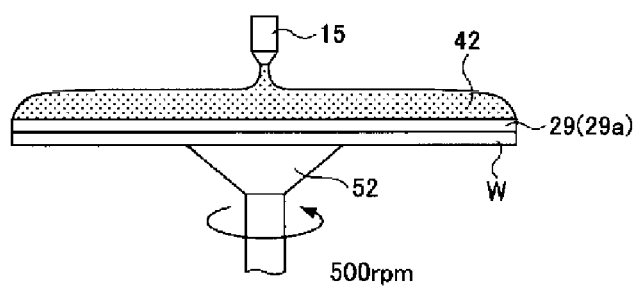

As shown in FIG. 8B, the developing solution nozzle 36 is moved out of the cup, and the rinse nozzle 15 is moved to a position above an approximate center of the wafer W. Then, as illustrated in FIG. 8C, the rinse solution 42 is supplied while the wafer W is being rotated, so that the developing solution 41 is washed away. Here, since the supply of the rinse solution 42 is performed while the wafer W is being rotated, the surface of the wafer W can be rinsed by the rinse solution 42 while the developing solution 41 is scattered away.

A liquid film (pure water puddle) of the rinse solution (pure water) 42 is formed on the surface of the wafer W. In order to prevent a top surface 29a of the resist pattern 29 to be described later with reference to FIG. 12 from being exposed out of the rinse solution 42, the rotation speed of the wafer W is set to be relatively low, e.g., about 0 rpm to about 1200 rpm and, more desirably, about 500 rpm. If the top surface 29a of the resist pattern 29 is exposed out of the rinse solution 42, pattern collapse may be caused due to a surface tension of the rinse solution 42. Thus, by rotating the wafer W at a relatively low speed of about 0 rpm to about 1200 rpm, a flow velocity of the rinse solution 42 on the wafer W can be reduced, so that collapse of the resist pattern 29 can be avoided when the developing solution 41 is removed. Alternatively, the wafer W may be rotated in multiple steps. For example, the wafer W may be rotated at about 100 rpm for about 2 seconds, then rotated at about 1200 rpm for about 3 seconds and then rotated at about 500 rpm for about 10 seconds.

Subsequently, the film thickness adjusting process (step S13) is performed. In the film thickness adjusting process (step S13), the supply of the rinse solution 42 is stopped, and a part of the rinse solution 42 is scattered away by rotating the wafer W, and, thus, a thickness of the liquid film of the rinse solution 42 is adjusted.

Figure 8D:
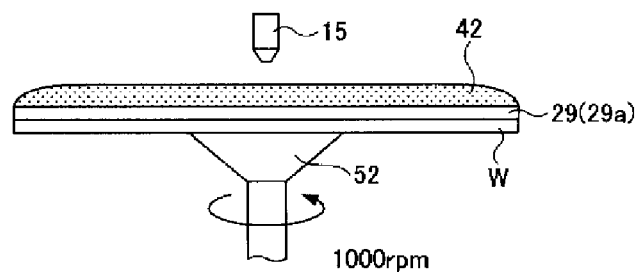

As depicted in FIG. 8d, the thickness of the liquid film (pure water puddle) of the rinse solution (pure water) 42 is reduced by increasing the rotation speed of the wafer W. By reducing the thickness of the liquid film (pure water puddle) of the rinse solution (pure water) 42, a part of the rinse solution may be repelled and a part of the surface of the wafer W would be exposed when the vapor 44 of the first processing solution is supplied during the subsequent rinse solution removing process (steps S14 to S16). Thus, an interface B between the rinse solution 42 and an atmosphere (vapor 44 of the first processing solution) can be formed on the surface of the wafer W. The rotation speed of the wafer W may be set to be, e.g., about 1000 rpm.

Thereafter, the rinse solution removing process (steps S14 to S16) is carried out. In the rinse solution removing process (step S14 to step S16), the wafer W is rotated while the vapor 44 of the first processing solution is supplied onto the wafer W, so that the rinse solution 42 is scattered (spun) and removed away. Further, the rinse solution removing process (step S14 to step S16) includes the first removing process (step S14), the second removing process (step S15) and the third removing process (step S16), as mentioned above.

Below, there will be discussed an example in which the rinse solution 42 is scattered and removed by rotating the wafer W while the vapor 44 of the first processing solution is being supplied onto the wafer W. However, it may be also possible to rotate the wafer W after the vapor 44 of the first processing solution is supplied. In such a case, although the rotation of the wafer W is not performed while the vapor 44 of the first processing solution is being supplied, the wafer W may be rotated in an atmosphere including the vapor 44 of the first processing solution, so that the rinse solution 42 is scattered and removed away from the wafer W.

First, the first removing process (step S14) is carried out. In the first removing process (step S14), the wafer W is rotated while the vapor 44 of the first processing solution is being supplied onto the approximate center of the wafer W, so that the rinse solution 42 is scattered and removed away.

Figure 9A:
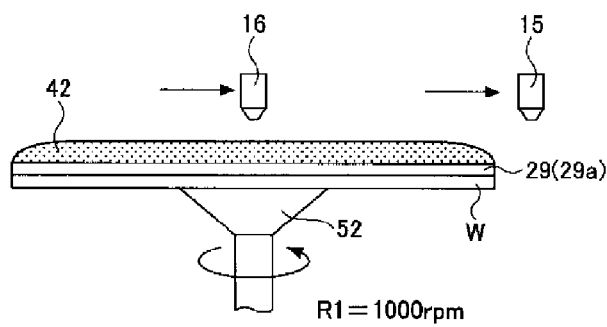
FIGS. 9A to 9D are second side views for illustrating respective processes of the developing method using the developing unit.
Figure 9B:
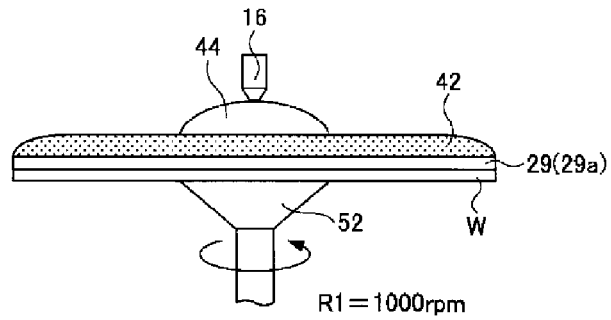

As illustrated in FIG. 9A, the rinse nozzle 15 is moved out of the cup CP, and the vapor supply nozzle 16 is moved to a position above the approximate center of the wafer W. Then, as illustrated in FIG. 9B, while supplying the vapor 44 of the first processing solution from the vapor supply nozzle 16 located at a position above the approximate center of the wafer W, the wafer W is rotated by the driving motor 54 at a first rotation speed R1 for a first time T1.

When the vapor supply nozzle 16 is located at the 'position above the approximate center of the wafer W', the position of the vapor supply nozzle 16 may be referred to as a first position P1. By way of example, the first position P1 may be, e.g., about 0 mm to about 5 mm and, more desirably, about 0 mm.

The first rotation speed R1 may be adjusted so as to reduce the thickness of the liquid film (pure water puddle) of the rinse solution (pure water) 42, as in the film thickness adjusting process (step S13). By way of example, the first rotation speed R1 may be set to be about 500 rpm to about 1500 rpm and, more particularly, to about 1000 rpm.

The first time T1 may be substantially the same as a time period taken until the interface between the rinse solution 42 and the atmosphere (vapor 44 of the first processing solution) is formed on the surface of the wafer W after the supply of the vapor 44 of the first processing solution is begun, as will be described below. Further, the first time T1 may be a time period during which the resist pattern 29 is not dissolved. Since the TMSDMA used as the hydrophobicizing agent has a property of dissolving the resist, it is necessary that the first time T1 may be set to be, e.g., about 0.5 to about 5 seconds and, more desirably, about 3 seconds.

Figure 9C:
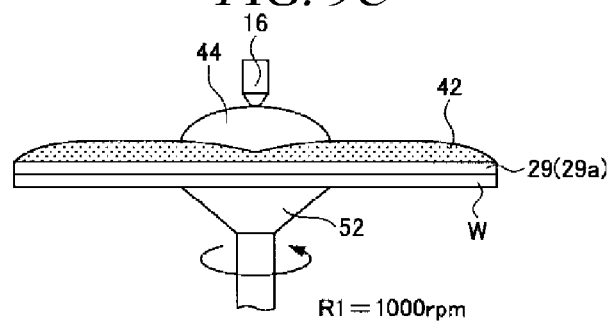
Figure 9D:
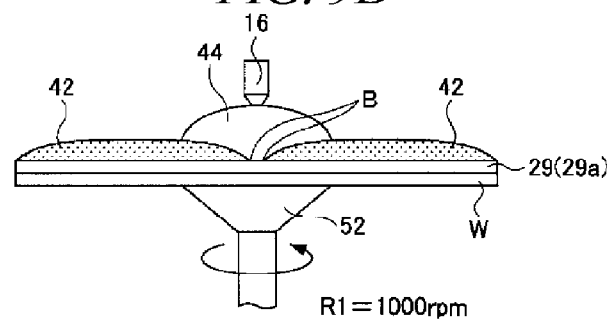

As illustrated in FIG. 9c, if the vapor 44 of the first processing solution is supplied and, thus, a concentration, i.e., a pressure of the vapor 44 of the first processing solution increases at the approximate center of the wafer W, the rinse solution 42 may be moved to a periphery of the wafer W in which the concentration, i.e., the pressure of the vapor 44 of the first processing solution is low. As a result, the liquid film of the rinse solution 42 may be recessed at the approximate center of the wafer W, so that a thickness of the liquid film at the approximate center of the wafer W would be reduced, whereas the thickness of the liquid film at the periphery of the wafer W would be increased. Then, if the vapor 44 of the first processing solution continues to be supplied and the rinse solution 42 is scattered away by the rotation of the wafer W, a part of the rinse solution 42 may be repelled on the approximate center of the wafer W and be removed away, as illustrated in FIG. 9D. As a consequence, a part of the surface of the wafer W may be exposed, and the interface B between the rinse solution 42 and the atmosphere (vapor 44 of the first processing solution) is formed on the surface of the wafer W.

If the concentration of the vapor 44 of the first processing solution increases at the approximate center of the wafer W, the vapor 44 of the first processing solution and the rinse solution 42 may be mixed with each other, resulting in reduction of the surface tension of the rinse solution 42. Furthermore, if the concentration of the vapor of the first processing solution 44 increases at the approximate center of the wafer W, the vapor 44 of the first processing solution and the rinse solution 42 may be mixed with each other, and the mixture may reach the surface of the resist pattern 29 on the wafer W and may hydrophobicize the surface of the resist pattern 29.

Further, in FIGS. 9B to 10D, the vapor 44 of the first processing solution supplied from the vapor supply nozzle 17 is shown to have a certain area for the purpose of illustration. Since, however, the vapor 44 of the first processing solution diffuses as a gas, there exists no clear boundary.

Subsequently, the second removing process (step S15) is performed. In the second removing process (step S15), the rinse solution 42 is scattered away by rotating the wafer W while slightly shifting the position, where the vapor 44 of the first processing solution is supplied onto the wafer W, toward the periphery of the wafer W from the approximate center thereof.

Figure 10A:
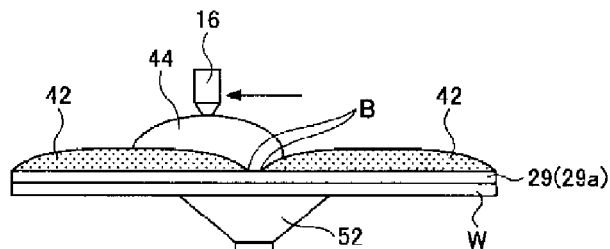
FIGS. 10A to 10D are third side views for illustrating respective processes of the developing method using the developing unit.
Figure 10B:
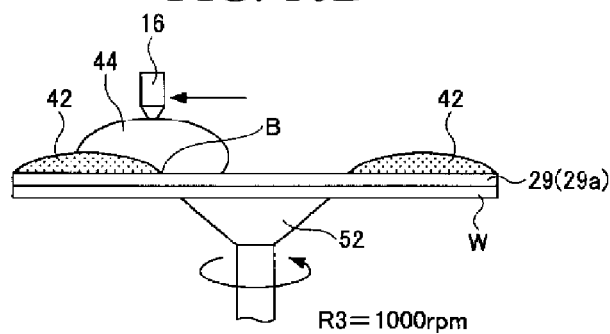
Figure 10C:
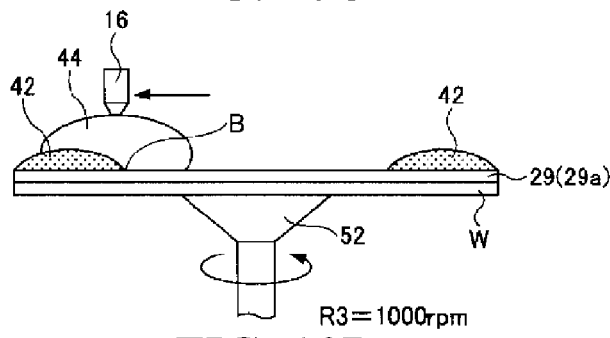
Figure 10D:
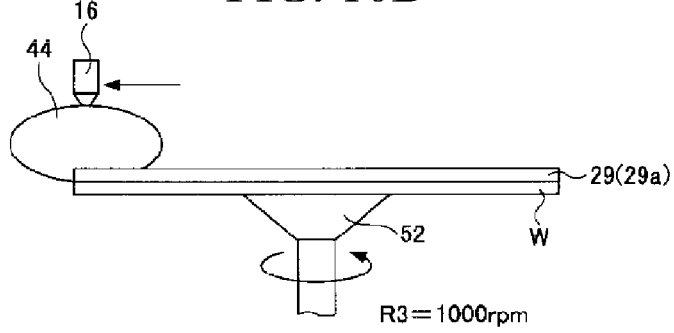

As illustrated in FIG. 10A, while the position of the vapor supply nozzle 16 with respect to the approximate center of the wafer W is being shifted to a position slightly deviated toward the periphery of the wafer W from the approximate center of the wafer W by the motor 19 for a second time T2, the wafer W is rotated at a second rotation speed R2 by the driving motor 54.

When the vapor supply nozzle 16 is located at the 'position slightly deviated toward the periphery of the wafer W' from the center of the wafer W, the position of the vapor supply nozzle 16 may be referred to as a second position P2. By way of example, the second position P2 may be, e.g., about 5 mm to about 50 mm and, more desirably, about 25 mm.

The second rotation speed R2 may be adjusted to reduce a speed for moving the interface B between the rinse solution 42 and the atmosphere (vapor 44 of the first processing solution) toward the periphery of the wafer W, as will be described later. Desirably, the second rotation speed R2 may be lower than the first rotation speed R1, and the second rotation speed R2 may be set to be about 0 rpm to about 500 rpm and, more desirably, about 100 rpm.

The second time T2 may be substantially the same as a time period taken until the interface B between the rinse solution 42 and the atmosphere (vapor 44 of the first processing solution) starts to be moved instantly toward the periphery of the wafer W after the interface B is formed, as will be described below. Further, the second time T2 may be a time period during which the resist pattern 29 is not dissolved. By way of example, the second time T2 may be set to be, e.g., about 0.5 to about 10 seconds and, more desirably, about 3 seconds.

In the first removing process (step S14), as a part of the rinse solution 42 is repelled on the approximate center of the wafer W, a part of the surface of the wafer W may be exposed, and the interface B between the rinse solution 42 and the atmosphere (vapor 44 of the first processing solution) may be formed on the surface of the wafer W. In this state, if the wafer W is rotated at the same speed, the rinse solution 42 may be scattered away, so that the interface B between the rinse solution 42 and the atmosphere (vapor 44 of the first processing solution) may be moved toward the periphery of the wafer W instantly. If, however, the interface B between the rinse solution 42 and the atmosphere (vapor 44 of the first processing solution) is moved toward the periphery of the wafer W too fast, the surface tension of the rinse solution 42 may not be reduced, or the surface of the resist pattern 29 may not be hydrophobicized by the vapor 44 of the first processing solution, resulting in collapse of the resist pattern 29. Accordingly, in the second removing process (step S15), by shifting the position for supplying the vapor 44 of the first processing solution slightly toward the periphery of the wafer W from the approximate center thereof, the surface tension of the rinse solution 42 may be reduced at the periphery of the wafer W or the surface of the resist pattern 29 may be hydrophobicized thereat. Further, by decreasing the rotation speed of the wafer W, the speed at which the interface B between the rinse solution 42 and the atmosphere (vapor 44 of the first processing solution) is moved toward the periphery of the wafer W can also be decreased. Then, instant shift of the interface B between the rinse solution 42 and the atmosphere (vapor 44 of the first processing solution) toward the periphery of the wafer W is awaited.

In accordance with the first embodiment, in the first removing process (step S14), the vapor supply nozzle 16 is shifted toward the periphery of the wafer W as illustrated in FIG. 10A after the interface B between the rinse solution and the atmosphere (vapor 44 of the first processing solution) is formed on the approximate center of the wafer W as depicted in FIG. 9D. However, the shift of the vapor supply nozzle 16 may be started at the same time or slightly before the interface B between the rinse solution 42 and the atmosphere (vapor 44 of the first processing solution) is formed on the approximate center of the wafer W. In such a case, in the first removing process (step S14), the rinse solution 42 may be scattered away by rotating the wafer W while supplying the vapor 44 of the first processing solution onto the approximate center of the wafer W in a state that the surface of the approximate center of the wafer W is yet to be completely dried. Furthermore, in the second removing process (step S15), in a state that the surface of the approximate center of the wafer W is yet to be completely dried, the rinse solution 42 may be scattered away by rotating the wafer W while slightly shifting the position for supplying the vapor 44 of the first processing solution toward the periphery of the wafer W from the approximate center thereof. In such a case, this state is not exactly the same as the state shown in FIG. 9D.

Subsequently, the third removing process (step S16) is performed. In the third removing process (step S16), the rinse solution 42 is scattered and removed by rotating the wafer W while instantly shifting the position where the vapor 44 of the first processing solution is supplied to an approximate edge of the wafer W.

As illustrated in FIGS. 10A to 10D, while the position of the vapor supply nozzle 16 with respect to the center of the wafer W is instantly shifted to the approximate edge of the wafer W for a third time T3 by the motor 19, the wafer W is rotated at a third rotation speed R3 by the driving motor 54.

When the vapor supply nozzle 16 is located at 'the approximate edge of the wafer W', the position of the vapor supply nozzle 16 may be referred to as a third position P3. By way of example, the third position P3 may be set to be about 100 mm to about 200 mm and, more particularly, about 150 mm.

The third rotation speed R3 may be adjusted so as to allow the interface B between the rinse solution 42 and the atmosphere (vapor 44 of the first processing solution) to be instantly moved to the approximate edge of the wafer W, as will be described later. Desirably, the third rotation speed R may be higher than the second rotation speed R2. By way of example, the third rotation speed R3 may be in the range of about 500 rpm to about 1500 rpm and, more desirably, the third rotation speed R3 may be about 1000 rpm.

The third time T3 may be substantially the same as a time period taken until the interface B between the rinse solution 42 and the atmosphere (vapor 44 of the first processing solution) is instantly moved to the approximate edge of the wafer W from the approximate center of the wafer W, as will be described below. Further, the third time T3 may be a time period during which the resist pattern 29 is not dissolved. By way of example, the third time T3 may be set to be, e.g., about 1 second to about 10 seconds and, more desirably, about 1 second.

By increasing the rotation speed of the wafer W, the interface B between the rinse solution 42 and the atmosphere (vapor 44 of the first processing solution) is instantly moved to the periphery of the wafer W. Further, by instantly moving the vapor supply nozzle 16 to the approximate edge of the wafer W, the position where the vapor 44 of the first processing solution is supplied to the wafer W can be moved along with the interface B between the rinse solution 42 and the atmosphere (vapor 44 of the first processing solution). That is, by rotating the spin chuck 52 by the driving motor 54 while moving the position, where the vapor 44 of the first processing solution is supplied, at a speed corresponding to a speed at which the rinse solution 42 is scattered and moved by the motor 19, the rinse solution 42 can be scattered (spun) and removed.

Further, in the first embodiment, the rinse solution removing process is described to include steps S14 to S16. However, the rinse solution 42 may be removed by performing only step S14 without performing steps S15 and S16. That is, the rinse solution 42 may be scattered and removed by rotating the wafer W while supplying the vapor 44 of the first processing solution to the approximate center of the wafer W without moving the vapor supply nozzle 16 from the approximate center of the wafer W.

Then, the drying process (step S17) is performed. In the drying process (step S17), the wafer W is rotated at a preset rotation speed and thus is dried.

Figure 11:
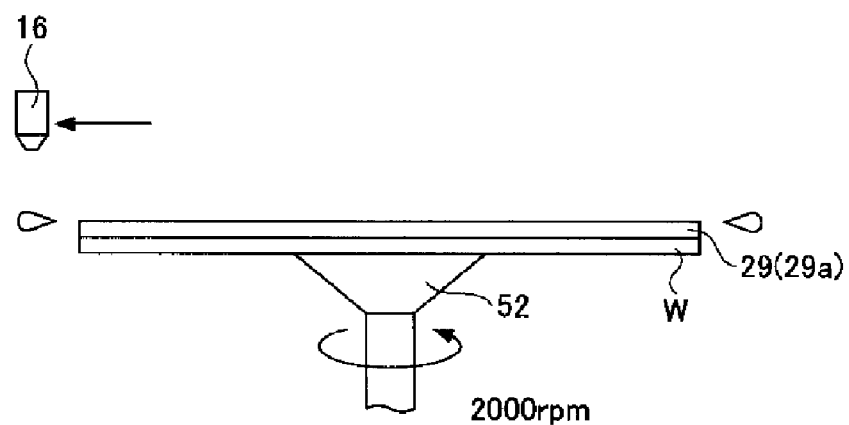
FIG. 11 is a fourth side view for illustrating respective processes of the developing method using the developing unit.

As illustrated in FIG. 11, the wafer W is rotated by the driving motor 54 at a high rotation speed of, e.g., about 1500 rpm to about 2500 rpm, more desirably, about 2000 rpm, so that the surface of the wafer W is sufficiently dried.

Furthermore, in the first embodiment, the rinse solution 42 may not be supplied again for cleaning after the rinse solution removing process (steps S14 to S16). However, depending on conditions such as the kind of the resist or the rinse solution 42, the shape of the resist pattern 29 on the wafer W, and the like, a rinse solution supply process may be performed again between the rinse solution removing process and the drying process (step S17). In such a case, since the surface of the resist pattern 29 is already hydrophobicized as a result of performing the rinse solution removing process (steps S14 to S16), the resist pattern 29 may not collapse even if the rinse solution supply process is performed again.

Below, an effect of preventing collapse of a resist pattern by using the vapor of the first processing solution and an effect of reducing an amount of usage of the first processing solution in accordance with the first embodiment will be discussed. Further, in the following description, a resist pattern may be simply referred to as a 'pattern'.

Figure 12:
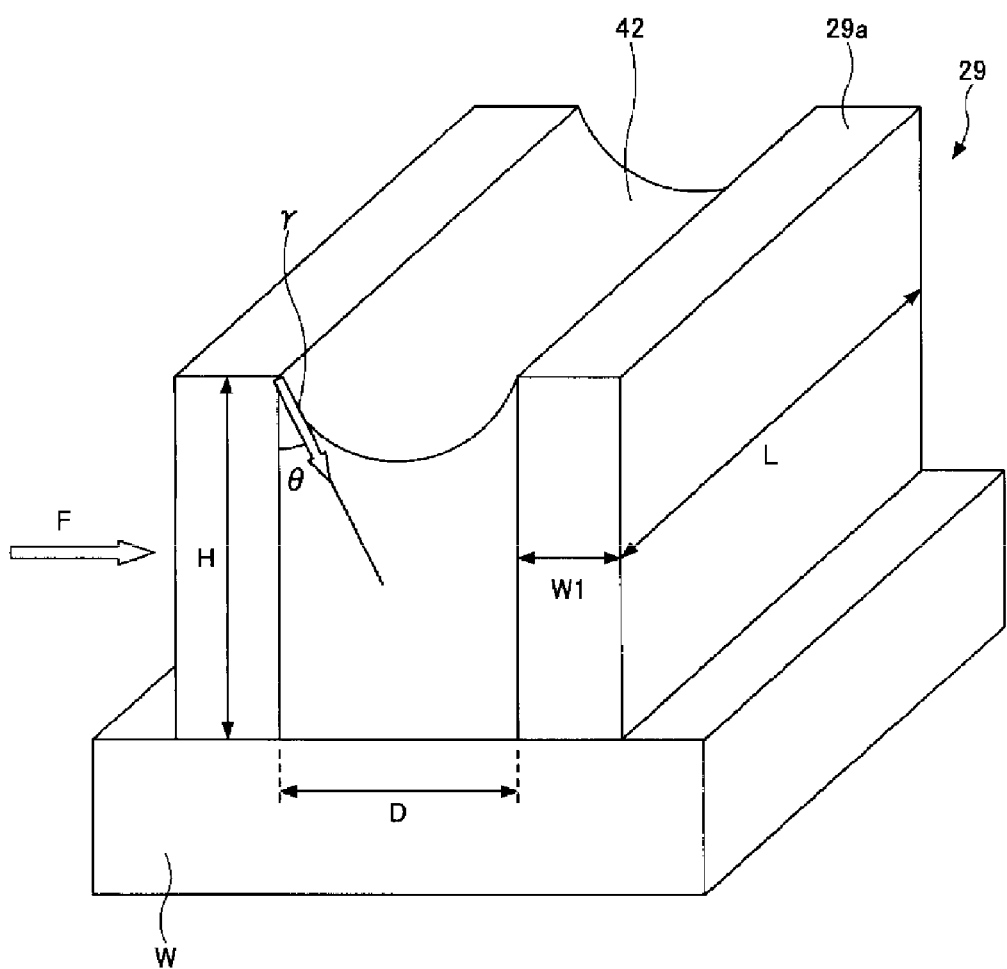
FIG. 12 is a diagram for describing a relationship between a contact angle of a rinse solution and a force applied to collapse patterns when the rinse solution exists between the patterns.

FIG. 12 provides a diagram for describing a relationship between a contact angle of a rinse solution and a force for collapsing patterns when the rinse solution exists between the patterns. In the course of drying the rinse solution 42 after rinsing a gap between two resist patterns 29 by the rinse solution 42, one side of the resist pattern 29 may be in contact with the rinse solution 42 while the other side thereof is dried and is in contact with air, as depicted in FIG. 12. In such a state, since the one side of the resist pattern 29 is pressed by the rinse solution 42 while the other side is pressed by the air, a force for collapsing the resist patterns 29 may be exerted due to such a pressure difference. The force F for collapsing the patterns may be represented by the following Eq. (1).

[Eq. 1]

$$F = \frac{2\gamma\cos\theta}{D}HL \quad (1)$$

Here, $\gamma$ is a surface tension of the rinse solution; $\theta$, a contact angle of the rinse solution with respect to a pattern; D, a distance between patterns; H, a height of the pattern; and L, a length of the pattern. The force F for collapsing the pattern generates a moment for bending the pattern. If the width of the pattern is W1, a maximum stress $\sigma_{MAX}$ applied to the pattern may be represented by the following Eq. (2).

[Eq. 2]

$$\sigma_{MAX} = \frac{6\gamma\cos\theta}{D}\left(\frac{H}{W1}\right)^2 \quad (2)$$

Accordingly, when $\sigma_{MAX}$ exceeds a collapse stress $\sigma_{CRT}$ ($\sigma_{MAX} > \sigma_{CRT}$) of the pattern, the pattern may be collapsed. Based on these equations, some methods to prevent collapse of the pattern may be considered: (1) enlarging the distance D between patterns; (2) reducing an aspect ratio of the pattern by decreasing the height H of the pattern or by increasing the width W1 of the pattern; (3) reducing the surface tension $\gamma$ of the rinse solution 42; and (4) reducing $\cos\theta$ by increasing the contact angle $\theta$ of the rinse solution 42 with respect to the pattern.

Among the mentioned methods, in the developing method in accordance with the first embodiment, the maximum stress $\sigma_{MAX}$ applied to the pattern may be reduced to prevent the pattern collapse by (3) decreasing the surface tension $\gamma$ of the rinse solution 42 or by (4) increasing the contact angle $\theta$.

Figure 13:
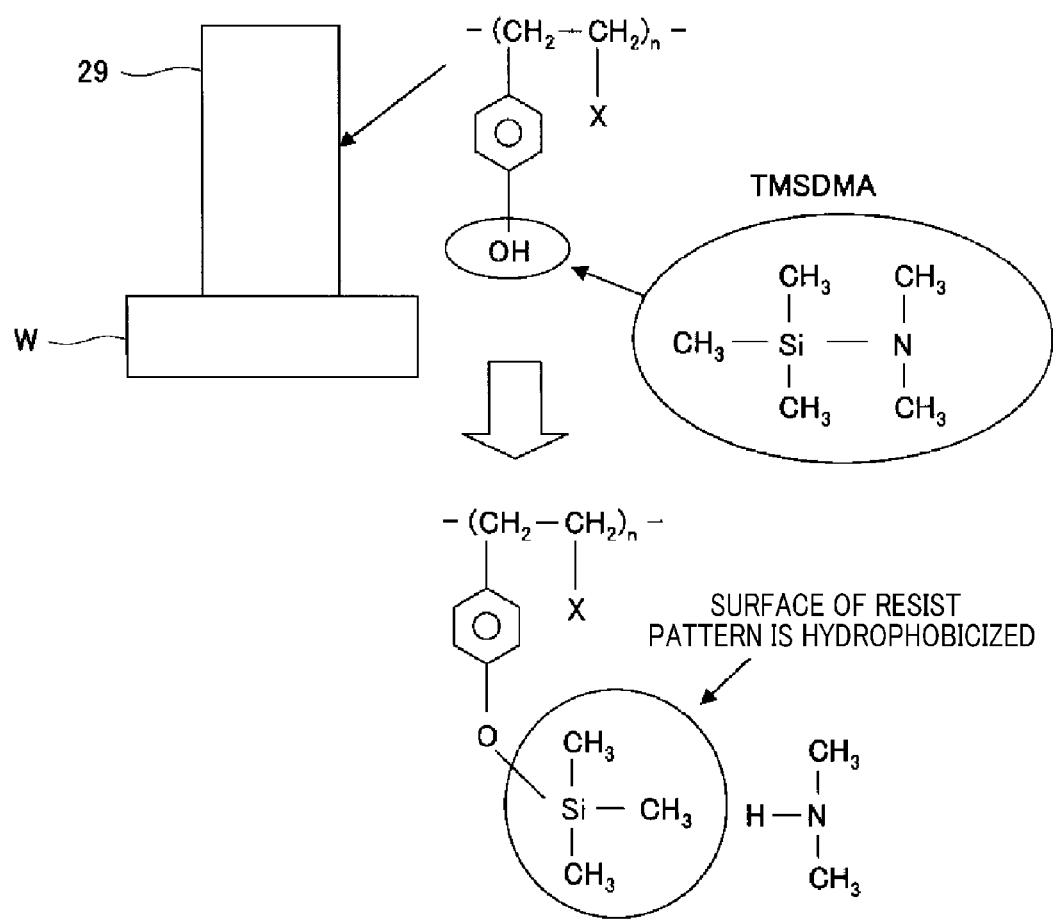
FIG. 13 is a diagram for describing a reaction mechanism in a hydrophobicizing process in which a first processing solution including TMSDMA hydrophobicizes a surface of a resist pattern.

FIG. 13 is a diagram for describing a reaction mechanism of a hydrophobicizing process for hydrophobicizing a surface of a resist pattern by a first processing solution including TMSDMA. TMSDMA included in the processing solution may have a silyl group of $(CH_3)_3Si$ in its molecule. Meanwhile, resist has an OH group in its polymer structure. The silyl group of the TMSDMA is substituted with H of the OH group of the resist on the surface of the resist pattern. The OH group is hydrophilic, whereas a group formed by substituting the H of the OH group with the silyl group is hydrophobic. Accordingly, the surface of the resist pattern may be hydrophobicized by the hydrophobic group formed on the surface of the resist pattern.

The contact angle $\theta$ of the rinse solution 42 with respect to the resist pattern 29 shown in FIG. 12 was measured after the completion of the rinse solution removing process for removing the rinse solution 42 while supplying the vapor 44 of the first processing solution, and the contact angle $\theta$ was found to range from about 85° to about 95°. Accordingly, when the rinse solution 42 is removed from between the patterns, pattern collapse may not be caused. Furthermore, once the contact angle $\theta$ of the rinse solution 42 with respect to the resist pattern 29 is increased, i.e., after the hydrophobicization of the surface of the resist pattern 29 is performed, such a large contact angle can also be achieved for the rinse solution 42 composed of pure water.

In the present embodiment, a first processing solution composed of TMSDMA diluted with HFE may be used instead of TMSDMA. Even if the TMSDMA is diluted with HFE, it is also possible to achieve the effect of hydrophobicizing the surface of the resist pattern by the silyl group in the TMSDMA. Meanwhile, since the HFE has fluorine, the surface of the resist pattern 29 may be coated with fluorine. Accordingly, even in case the first processing solution composed of the TMSDMA diluted with the HFE is used, a contact angle in the above-specified high angular range can also be obtained.

Further, a hydrophobic group is formed on the surface of the resist pattern 29 by the silyl group of the TMSDMA, so that the surface of the resist pattern 29 is hydrophobicized. By way of example, after the hydrophobic group is formed, an additional reaction may be made by performing heat treatment such as post baking, and, thus, the surface of the resist pattern 29 may be chemically stabilized, as in the case of so-called silylation. Accordingly, since the surface of the resist pattern 29 has resistance against etchant used in a subsequent process of etching the wafer W by using the resist pattern 29 as a mask, selectivity, i.e., a ratio of an etching rate of the wafer W to an etching rate of the resist pattern 29 can be improved, and formation of finer patterns or formation of patterns having a higher aspect ratio can be carried out accurately.

Now, investigation result of a pattern collapse preventing effect by the developing method in accordance with the first embodiment will be described with reference to Table 2.

Experimental Example 1

In an experimental example 1, as for wafers on which resist was coated and pattern exposure was performed while varying a dose amount during the exposure in the range of about 27 mJ to about 32 mJ, development of resist patterns formed on the wafers was carried out by performing steps S11 to S17 as described in FIG. 7. Each of steps S13 to S17 was performed according to example processing recipes specified in Table 1. In steps S14 to S16, a vapor of a first processing solution made of 100% of TMSDMA was used. The resist pattern was formed to have a line width of about 120 nm, a space width of about 120 nm (a pitch of about 240 nm) and a height of about 380 nm. Then, by using a SEM (Scanning Electron Microscope), it was observed whether collapse of pattern had occurred in the patterns formed by using the respective dose amounts. The result is depicted in Table 2.

Comparative Example 1

In a comparative example 1, as for wafers on which the same pattern exposure as in the experiment example 1 was performed, development of resist patterns having the same shapes as those in the experimental example was conducted by performing steps S11 to S13 and step S17 in FIG. 7 while omitting steps S14 to S16. In this example, however, a rinse solution composed of HFE was used in step S13 instead of using pure water. Further, as in the experimental example 1, it was observed whether collapse of pattern had occurred in the patterns formed by using respective dose amounts. The result is depicted in Table 2.

Comparative Example 2

In a comparative example 2, as for wafers on which the same pattern exposure as in the experiment example 1 was performed, development of resist patterns having the same shapes as those in the experimental example was conducted by performing steps S11 to S13 and step S17 in FIG. 7 while omitting steps S14 to S16. The comparative example 2 corresponds to a conventional developing process in which rinse is performed by using pure water. Further, as in the experimental example 1, it was observed whether collapse of pattern had occurred in the patterns formed by using respective dose amounts. The result is depicted in Table 2.

TABLE 2

| Example | Dose amount (mJ) during exposure | | | | | |
|---|---|---|---|---|---|---|
| | 27 | 28 | 29 | 30 | 31 | 32 |
| Experimental example 1 (Removing rinse solution in atmosphere of vapor of TMSDMA) | ○ | ○ | ○ | ○ | ○ | ○ |
| Comparative example 1 (Removing rinse solution after substituting the rinse solution with HFE) | ○ | ○ | X | ○ | X | X |
| Comparative example 2 (Removing rinse solution (pure water)) | ○ | ○ | X | X | X | X |

(○: no pattern collapse has occurred, X: pattern collapse has occurred)

In Table 2, ○ indicates that pattern collapse has not occurred under the corresponding condition, while x indicates that pattern collapse has occurred under the corresponding condition.

As shown in the results of Table 2, no pattern collapse has occurred under all conditions in the experimental example 1. Meanwhile, in the comparative examples 1 and 2, pattern collapse has occurred under some specific conditions. Thus, it is clear that pattern collapse can be more effectively suppressed in the experimental example 1 than in the comparative examples 1 and 2. It is because a maximum stress $\sigma_{MAX}$ applied to the pattern is reduced by substituting H of an OH group on the surface of a resist pattern with a silyl group of the TMSDMA so as to improve hydrophobic property and increasing a contact angle θ of the rinse solution with respect to the pattern.

Furthermore, in the first embodiment, since the vapor of the first processing solution is supplied, the amount of usage of the first processing solution can be reduced as compared to a case of directly supplying the first processing solution itself. By way of example, in the present embodiment, the amount of the first processing solution used for processing one sheet of wafer may be about 2.5 μl. On the contrary, if the first processing solution in a liquid phase is supplied, not a vapor, the amount of the first processing solution for processing one sheet of wafer may be about 100 μl in order to obtain the same effect. Accordingly, in accordance with the present embodiment, the amount of usage of the hydrophobicizing agent can be reduced to about 1/40, so that cost for substrate processing can be reduced greatly.

The first embodiment has been described for the case of applying the substrate processing apparatus in accordance with the present disclosure to the developing apparatus and applying the substrate processing method in accordance with the present disclosure to the developing method. However, application of the substrate processing apparatus in accordance with the present disclosure may not be limited to the developing apparatus that performs a developing process on the substrate. By way of example, the substrate processing apparatus in accordance with the present disclosure may be also applicable to a single-substrate type cleaning apparatus that performs a cleaning process on a single substrate held on a spin chuck. When applying the substrate processing apparatus in accordance with the present disclosure to the cleaning apparatus, it may be possible to use an apparatus having the same configuration as that of the developing apparatus illustrated in FIGS. 4 and 5 excepting that it does not have the developing solution supply mechanism. Further, when applying the substrate processing method in accordance with the present disclosure to the cleaning method, the developing method described in FIG. 7 may be used while omitting the developing solution supply process.

First Modification Example of the First Embodiment

Now, referring to FIG. 14 and FIGS. 15A to 15E, a developing apparatus and a developing method in accordance with a first modification example of the first embodiment will be explained.

The developing apparatus in accordance with the first modification example is different from the developing apparatus in accordance with the first embodiment in that a rinse solution is removed while detecting a moving position of an interface between the rinse solution and an atmosphere when the rinse solution is scattered in the atmosphere including the vapor of the first processing solution.

Figure 14:
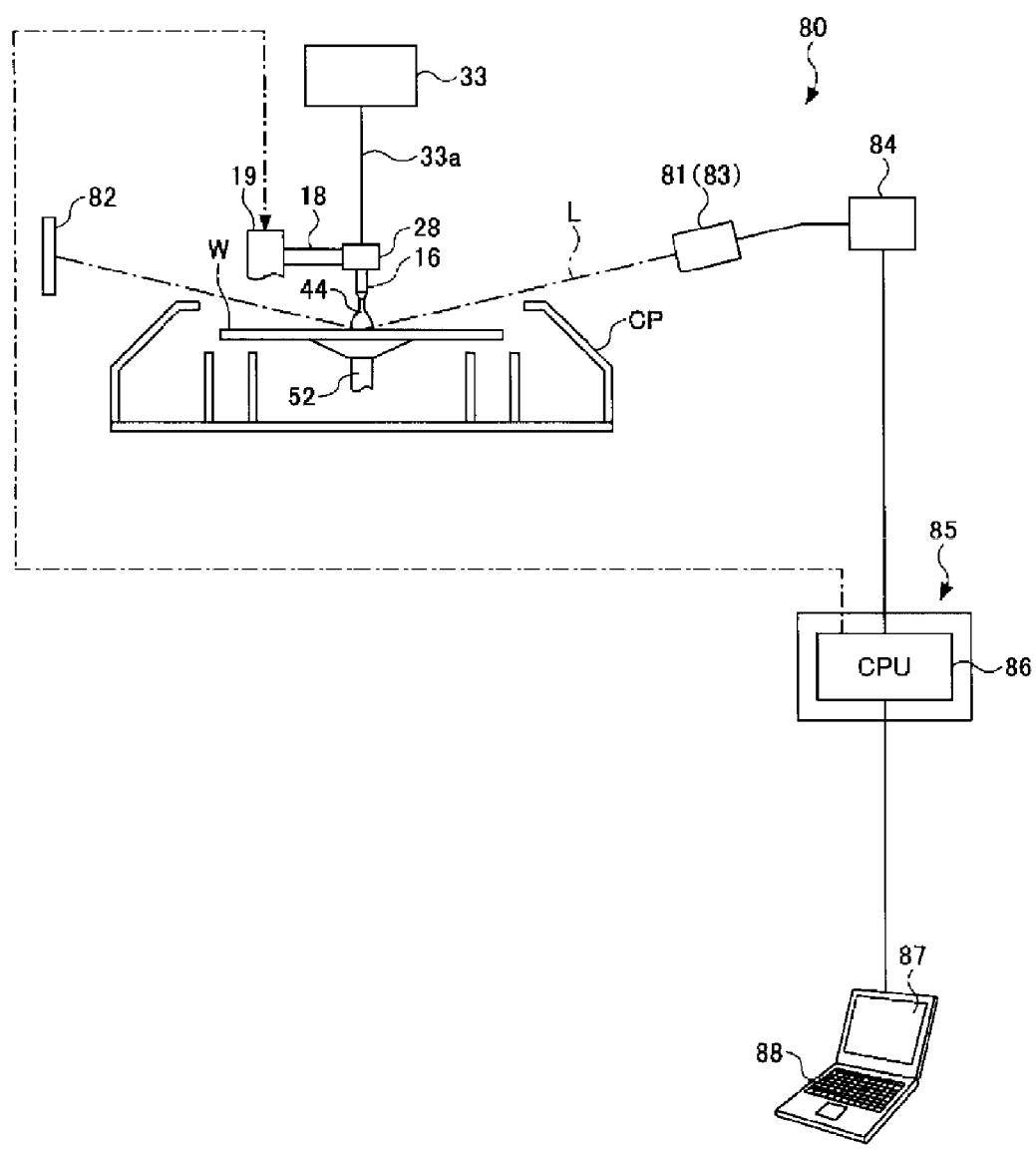
FIG. 14 is a cross sectional view illustrating a developing unit in accordance with a first modification example of the first embodiment.

FIG. 14 is a cross sectional view illustrating a developing unit in accordance with the first modification example. FIGS. 15A to 15E are schematic diagrams illustrating a principle of a method for detecting the position of the interface between the rinse solution and the atmosphere. In the following description (including description of the other modification examples and other embodiments below), the same parts as described above will be assigned same reference numerals, and elaboration thereof will be omitted. Further, in FIG. 14, illustration of a processing chamber is omitted.

In this modification example, units other than a developing unit DEV of a coating and developing system including the developing apparatus may be the same as those described in the first embodiment with reference to FIGS. 1 to 3.

Meanwhile, in this first modification example, there is provided a detecting unit 80 for detecting whether or not an interface B between a rinse solution 42 and an atmosphere (vapor 44 of a first processing solution) is formed when a part of the rinse solution is repelled and removed and a part of the surface of a wafer W is exposed on an approximate center of the wafer W.

Alternatively, the detecting unit 80 may detect a position of the interface B between the rinse solution 42 and the atmosphere (vapor 44 of the first processing solution) in order to shift a position, where the vapor 44 of the first processing solution is supplied onto the wafer W, at a speed corresponding to a speed at which the rinse solution 42 is scattered and moved.

As depicted in FIG. 14, the detecting unit 80 irradiates a laser beam L to the wafer W, held on a spin chuck 52, on which the rinse solution 42 has been supplied, and detects an amount of reflection light reflected from a surface of the wafer W. The detecting unit 80 includes a retro-reflective laser sensor (laser generating unit) 81, a reflecting plate 82 and a laser receiving unit 83. The laser generating unit 81 irradiates light of the laser beam L onto the surface of the wafer W, and the reflecting plate reflects the laser beam L irradiated to and reflected from the surface of the wafer W. The laser receiving unit 83 receives the reflected light of the laser beam L that is reflected by the reflecting plate 82 and reflected again on the surface of the wafer W. Further, although attenuation of the laser beam may vary depending on the kind of the wafer W, the attenuation of the laser beam can be reduced by minimizing a reflection angle.

Further, in the present modification example, the laser beam is used as the irradiation light irradiated to the wafer W. However, the irradiation light may not be limited to the laser beam, but it may be of any kind as long as it has some degree of straightforwardness. Here, instead of the retro-reflective laser sensor 81 and the laser receiving unit 83, a light generating unit and a light receiving unit corresponding to the irradiation light may be used.

The detecting unit 80 is connected with a detecting board 85 via an amplifier 84 so as to convert a detected analog signal into a digital signal for detection.

The detecting board 85 includes a CPU 86. The CPU 86 measures analog signals outputted from the detecting unit 80 and performs an operation for comparing a value obtained when the surface of the wafer W is covered with the rinse solution immediately before the interface B is formed and a value obtained when the interface B is formed and the surface of the wafer W is thus exposed. Alternatively, the CPU 86 may perform an operation for comparing any one of the analog signals with a preset threshold value. Further, the detecting board 85 is connected with a computer 88 that outputs a value of the detecting unit 80 and a determination result on a display 87 based on a signal from the CPU 86.

Further, the CPU 86 controls the motor 19 to rotate and move the vapor supply nozzle 16, so that the vapor supply nozzle 16 is rotated and moved, and the CPU 86 detects a position of the vapor supply nozzle 16 by detecting a rotation position of the motor 19.

Further, the detecting board 85, the CPU 86, the display 87 and the computer 88 and the like may be included in the controller 30.

Now, a developing method in accordance with the first modification example will be explained. The developing method in accordance with the present modification example is substantially the same as the developing method described in the first embodiment with reference to FIG. 7 excepting that the developing method in accordance with the first modification example is performed while the detecting unit 80 detects whether or not the interface B between the rinse solution 42 and the atmosphere (vapor 44 of the first processing solution) is formed. In the following, a principle of the method for detecting the position of the interface B between the rinse solution 42 and the atmosphere (vapor 44 of the first processing solution) will be described with reference to FIGS. 15A to 15E.

Figure 15A:
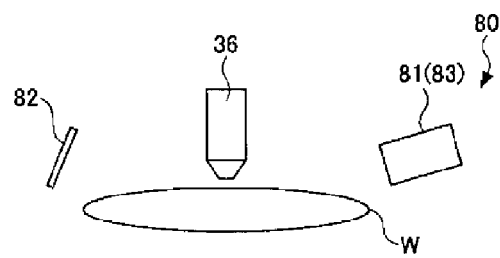
FIGS. 15A to 15E are schematic diagrams for illustrating a principle of a method for detecting a position of an interface between a rinse solution and an atmosphere.
Figure 15B:
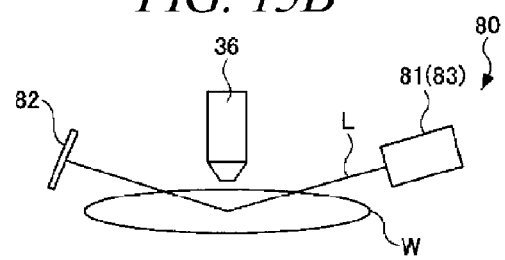
Figure 15C:
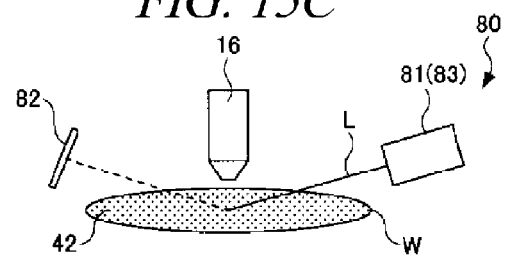
Figure 15D:
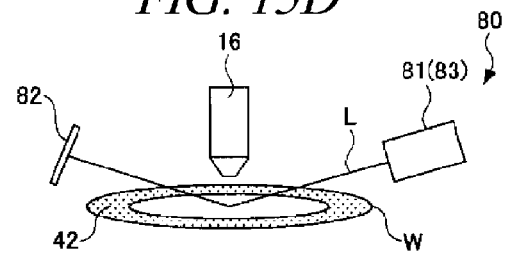

Before a developing solution supply process (step S11) is performed, the detecting unit 80 detects a received light amount (level 0) in an OFF-state while a wafer W is held on the spin chuck 52 in order to set a threshold value for noise margin that may be different depending on the kind of a wafer W (see FIG. 15A). Thereafter, when the developing solution supply process (step S11) is performed, the detecting unit 80 is operated at the moment a supply signal for a developing solution nozzle 36 is turned ON, and the detecting unit 80 measures (detects) a reflection amount of a laser beam L irradiated to a surface of the wafer W immediately before the supply of a developing solution 41 from the developing solution nozzle 36 is begun (see FIG. 15B). A measured analog signal is sent to the CPU 82 and the reflection light amount is compared with the received light amount of level 0, and the threshold value for noise margin is set based on a difference between them. Here, the threshold value for noise margin is set by measuring (detecting) the reflection amount of the laser beam L irradiated to the surface of the wafer W immediately before the developing solution 41 is supplied from the developing solution nozzle 36. However, the timing for measuring the reflection light amount may not be limited to immediately before the supply of the developing solution 41 from the developing solution nozzle 36 is started. That is, the reflection amount of the laser beam L irradiated to the surface of the wafer W may be measured (detected) at any point in time before the developing solution 41 is supplied from the developing solution nozzle 36, and the threshold value for noise margin can be set based on the detected reflection light amount.

Subsequently, a rinse solution supply process (step S12) and a film thickness adjusting process (step S13) are performed. A laser reflection amount is measured (detected) after a liquid film thickness of a rinse solution 42 on the surface of the wafer W is adjusted through the film thickness adjusting process (step S13). In this state, since the laser beam L is blocked by the rinse solution 42 and reflectivity decreases because of the rinse solution 42 staying on the wafer W, the reflection light amount may be almost level 0 (see FIG. 15C).

Thereafter, a rinse solution removing process (steps S14 to S16) is performed. While supplying the vapor 44 of the first processing solution from a vapor supply nozzle 16, the wafer W is rotated by a driving motor 54, so that the rinse solution 42 is scattered and removed away. In a first removing process (step S14), the wafer W is rotated while supplying the vapor 44 of the first processing solution onto an approximate center of the wafer W. As a consequence, the rinse solution 42 may be scattered and removed from the approximate center of the wafer W, and the surface of the wafer W may be exposed, resulting in improvement of reflectivity. Therefore, a high level of reflection light amount is detected (see FIG. 15D).

In other words, if a high level of reflection light amount is detected, it may be determined that the rinse solution 42 is scattered and removed on the approximate center of the wafer W. Accordingly, when the high level of reflection light amount is detected, a second removing process (step S15) may be started. That is, the rinse solution 42 may be removed while shifting a position, where the vapor 44 of the first processing solution is supplied to the wafer W, toward a periphery of the wafer W from the center of the wafer W based on the detected reflection light amount.

Figure 15E:
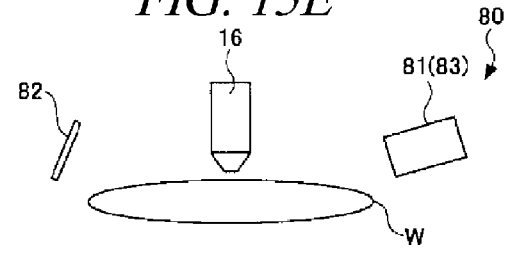

Then, after a drying process (step S17) is performed and the rinse solution 42 is removed from the surface of the wafer W, the detecting unit 80 is turned OFF (see FIG. 15E).

By using the detecting unit 80 as described above, it can be detected whether the rinse solution 42 exists on the surface of the approximate center of the wafer W. Accordingly, the first removing process (step S14) can be finished and the second removing process (step S15) can be started according to the time when the interface B between the rinse solution 42 and the atmosphere (vapor 44 of the first processing solution) is formed on the approximate center of the wafer W. Thus, the position where the vapor 44 of the first processing solution is supplied can be moved according to the position on which the rinse solution 42 is scattered and moved. As a result, pattern collapse can be more securely suppressed when the rinse solution 42 is removed.

Further, in this first modification example, a multiple number of the detecting units may be installed from the approximate center of the wafer W to the periphery of the wafer W so as to detect presence or absence of the rinse solution 42 at multiple positions on the wafer W. Alternatively, by rotating (moving) the laser generating unit 81 and the reflecting plate 82 synchronously so as to allow angles formed between the laser beam and the surface of the wafer W to be varied synchronously, presence or absence of the rinse solution 42 may be detected at multiple positions on the wafer W. In such a case, by detecting presence or absence of the rinse solution 42 at the multiple positions on the wafer W at the respective time, a speed at which the rinse solution 42 is scattered and moved on the wafer W can be calculated. Accordingly, the vapor supply nozzle 16 can be moved at a speed corresponding to a speed at which the interface B between the rinse solution 42 and the atmosphere (vapor 44 of the first processing solution) is moved. Thus, by way of example, the vapor supply nozzle 16 can be moved at the same speed as the speed at which the interface B between the rinse solution 42 and the atmosphere (vapor 44 of the first processing solution) is moved in the third removing process (step S16). That is, the rinse solution 42 may be removed while shifting the position where the vapor 44 of the first processing solution is supplied to the wafer W at the speed corresponding to the speed at which the rinse solution 42 is scattered and moved, based on the detected reflection light amount.

In this first modification example, a surface of a resist pattern may be hydrophobicized by the vapor of the first processing solution including a hydrophobicizing agent. Accordingly, pattern collapse can be suppressed when the rinse solution is supplied onto a substrate on which fine resist patterns are formed and then the rinse solution is removed from the substrate. Furthermore, by reducing an amount of usage of the hydrophobicizing agent, cost for substrate processing can be reduced.

Further, in accordance with the first modification example, the moving position of the interface between the rinse solution and the atmosphere can be accurately detected by the detecting unit, and the vapor supply nozzle can be moved to follow up the movement of the interface between the rinse solution and the atmosphere. Accordingly, the vapor of the first processing solution can be successfully supplied to the vicinity of the interface between the rinse solution and the atmosphere when the interface is moved. Thus, pattern collapse can be suppressed more effectively. Further, by further reducing an amount of usage of the hydrophobicizing agent, cost for substrate processing can be reduced.

Moreover, in the present modification example, although it has been described that the present disclosure is applied to the developing apparatus, the present disclosure may not be limited to the developing apparatus but can be applied to a single-wafer cleaning apparatus that performs a cleaning process on a substrate held on a spin chuck. Furthermore, in the present modification example, although it has been described that the present disclosure is applied to the developing method, the present disclosure may not be limited to the developing method but can be applied to a single-wafer cleaning method for performing a cleaning process on a substrate held on a spin chuck.

Second Modification Example of the First Embodiment

Now, referring to FIGS. 16 and 17, a developing apparatus and a developing method in accordance with a second modification example of the first embodiment will be described.

The developing apparatus in accordance with the second modification example is different from the developing apparatus in accordance with the first embodiment in that a processing solution supply nozzle is provided to a vapor supply nozzle.

Figure 16:
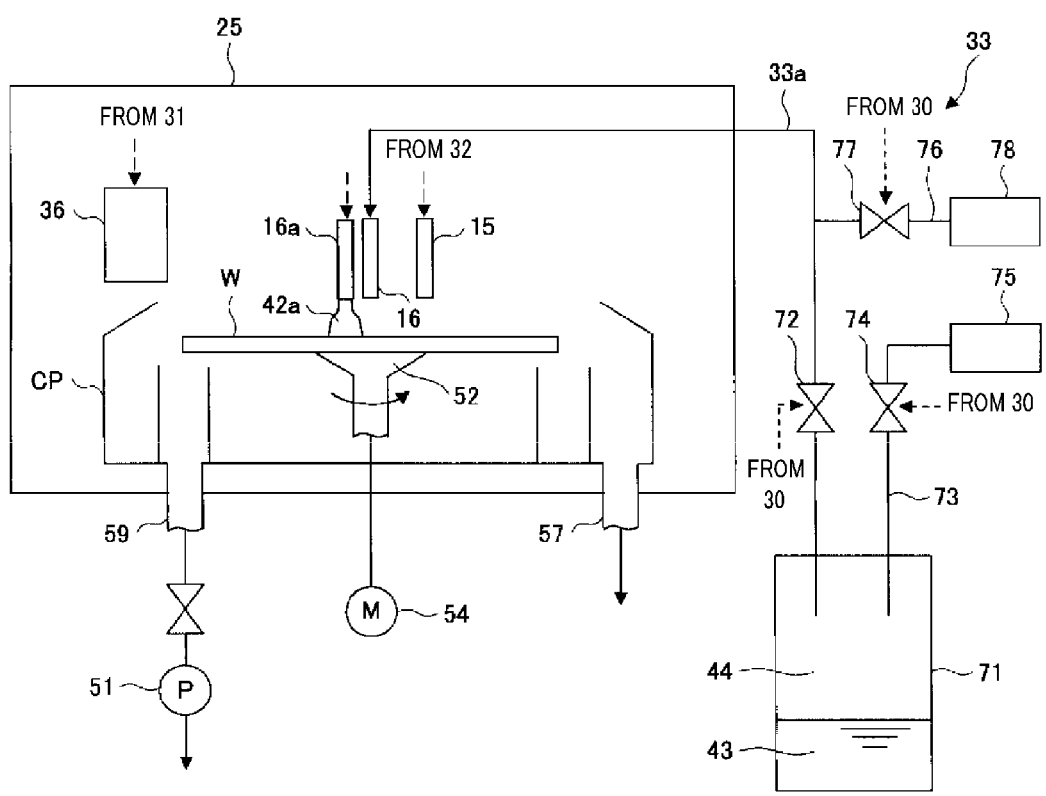
FIG. 16 is a schematic diagram illustrating major parts of a developing unit in accordance with a second modification example of the first embodiment.

FIG. 16 is a diagram schematically illustrating major parts of a developing unit in accordance with the second modification example.

In this second modification example, units other than a developing unit DEV of a coating and developing system including the developing apparatus may be the same as those described in the first embodiment with reference to FIGS. 1 to 3. Further, the developing unit DEV in accordance with the second modification example may have the same configuration as that of the developing unit DEV of the coating and developing system in accordance with the first embodiment excepting the processing solution supply nozzle. Thus, elaboration of parts in FIG. 16 already described in the first embodiment with reference to FIGS. 4 and 5 will be omitted.

FIG. 16 schematically illustrates nozzle positions when a rinse solution removing process is performed after a developing solution supply process to a film thickness adjusting process are performed as will be described below with reference to FIG. 17. That is, a developing solution nozzle 36 is located outside a cup CP; a rinse nozzle 15 is located at a position slightly deviated toward a periphery of a wafer W from an approximate center of a wafer W; and a vapor supply nozzle 16 is placed at position above the approximate center of the wafer W.

In the second modification example, a processing solution nozzle 16a is provided next to the vapor supply nozzle 16. The processing solution nozzle 16a, held by a non-illustrated nozzle holder, is fixed at a leading end of a non-illustrated nozzle scan arm. The processing solution nozzle 16a supplies a second processing solution 42a having a smaller surface tension than that of the rinse solution 42 on a surface of the wafer W. As in the case of the vapor supply nozzle 16, this nozzle scan arm may be rotatable about a non-illustrated motor in a θ direction by the motor. The second processing solution 42a is supplied into the processing solution nozzle 16a from a non-illustrated second processing solution supply mechanism through a non-illustrated supply pipe. Alternatively, the processing solution nozzle 16a may be fixed at a leading end of the nozzle scan arm 18 together with the vapor supply nozzle 16.

By way of example, the aforementioned HFE-based solvent having a smaller surface tension than that of the rinse solution 42 such as pure water may be used as the second processing solution 42a. Further, xylene, hexamethyldisilazane (HMDS) or the like may also be used.

Moreover, the processing solution nozzle 16a serves as a second processing solution supply unit in the present disclosure.

Now, a developing method in accordance with the second modification example will be discussed with reference to FIG. 17. FIG. 17 is a flowchart for describing a process sequence.

Figure 17:
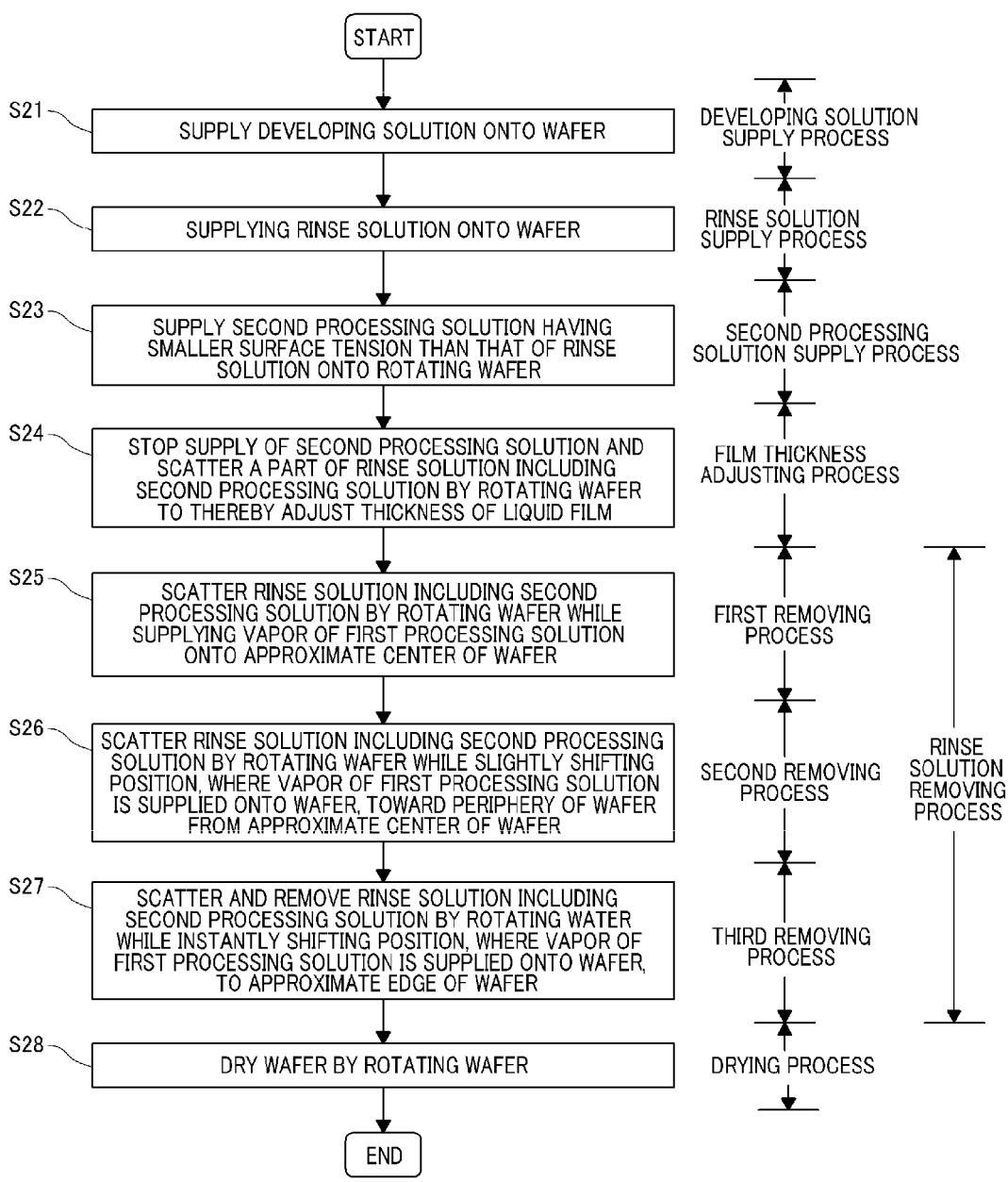
FIG. 17 is a flowchart for describing a process sequence of a developing method using the developing unit in accordance with the second modification example of the first embodiment.

As depicted in FIG. 17, the developing method in accordance with the second modification example may include a developing solution supply process (step S21), a rinse solution supply process (step S22), a second processing solution supply process (step S23), a film thickness adjusting process (step S24), a rinse solution removing process (steps S25 to S27) and a drying process (step S28). The rinse solution removing process may include a first removing process (step S25), a second removing process (step S26) and a third removing process (step S27).

First, the developing solution supply process (step S21) and the rinse solution supply process (step S22) are performed. The developing solution supply process (step S21) and the rinse solution supply process (step S22) may be carried out in the same ways as steps S11 and S12 in the first embodiment, respectively.

Then, the second processing solution supply process (step S23) is performed. In the second processing solution supply process (step S23), the second processing solution 42a is supplied onto the wafer W on which the rinse solution 42 has been already supplied.

The developing solution nozzle 36 is moved out of the cup CP, and the processing solution nozzle 16a is moved to a position above the approximate center of the wafer W. Then, the second processing solution 42a is supplied while the wafer W is being rotated. Since the supply of the second processing solution 42a is carried out while rotating the wafer W, the surface of the wafer W may be rinsed by the rinse solution 42 including the second processing solution 42a.

By way of example, a liquid film of the rinse solution 42 including the second processing solution 42a is formed on the surface of the wafer W, and a rotation speed of the wafer W may be set to be relatively low, e.g., about 0 rpm to about 1200 rpm, and more desirably, about 500 rpm so as not to allow a top surface of a developed resist pattern to be exposed out of the rinse solution 42. By rotating the wafer W at the relatively low speed of about 0 rpm to about 1200 rpm, a flow velocity of the rinse solution 42 including the second processing solution 42a on the wafer W can be reduced, thus preventing collapse of a resist pattern 29 when the rinse solution 42 including the second processing solution 42a is flown.

Further, in the second processing solution supply process (step S23), a large amount of second processing solution 42a may be supplied so as to substantially substitute the rinse solution 42 with the second processing solution 42a. On the contrary, in the second processing solution supply process (step S23), the second processing solution 42a may be just dripped on the wafer W on which the rinse solution 42 has been supplied. When dripping the second processing solution 42 on the wafer W, the second processing solution supply process (step S23) may not be performed prior to the rinse solution removing process, but it may be performed concurrently with the rinse solution removing process. That is, the rinse solution removing process (steps 25 to 27) may be performed while dripping the second processing solution 42a from the processing solution nozzle 16a without performing step S23.

Subsequently, the film thickness adjusting process (step S24) is carried out. The film thickness adjusting process (step S24) may be substantially the same as the film thickness adjusting process (step S13) in accordance with the first embodiment. In this film thickness adjusting process (step S24), the supply of the second processing solution 42a is stopped, and a part of the rinse solution 42 including the second processing solution 42a is scattered away by rotating the wafer W, and, thus, a thickness of the liquid film of the rinse solution 42 is adjusted.

Thereafter, the rinse solution removing process (steps 25 to 27) is performed. In the rinse solution removing process (steps 25 to 27), the wafer W is rotated while vapor 44 of a first processing solution is supplied onto the wafer W, so that the rinse solution 42 including the second processing solution 42a is scattered (spun) and removed away, as in the rinse solution removing process (steps S14 to S16) in accordance with the first embodiment.

Then, the drying process (step S28) is performed. In the drying process (step S28), the wafer W is dried by being rotated at a preset rotational speed, as in the drying process (step S17) in the first embodiment.

In the second modification example, the surface of the resist pattern may be hydrophobicized by the vapor of the first processing solution including a hydrophobicizing agent. Accordingly, pattern collapse can be suppressed when the rinse solution is supplied onto a substrate on which fine resist patterns are formed and then the rinse solution is removed from the substrate. Furthermore, by reducing an amount of usage of the hydrophobicizing agent, cost for substrate processing can be reduced.

In this second modification example, the second processing solution having a smaller surface tension than that of the rinse solution is supplied, and in the rinse solution removing process, the rinse solution including the second processing solution is scattered and removed by rotating the wafer W while supplying the vapor of the first processing solution including the hydrophobicizing agent. The rinse solution including the second processing solution has a smaller surface tension than that of the rinse solution. Accordingly, when the rinse solution is supplied onto the substrate on which fine resist patterns are formed and when the rinse solution is removed from this substrate, pattern collapse can be suppressed more securely.

Furthermore, HFE has a larger specific gravity than that of pure water. Accordingly, when HFE is used as the second processing solution, the second processing solution may be positioned under the rinse solution after the second processing solution supply process (step S23), thereby allowing the rinse solution to easily escape from the resist pattern. Thus, the effect of preventing pattern collapse can be further improved.

Moreover, in the present modification example, although it has been described that the present disclosure is applied to the developing apparatus, the present disclosure may not be limited to the developing apparatus but can be applied to a single-wafer cleaning apparatus that performs a cleaning process on a substrate held on a spin chuck. Furthermore, in the present modification example, although it has been described that the present disclosure is applied to the developing method, the present disclosure may not be limited to the developing method but can be applied to a single-wafer cleaning method for performing a cleaning process on a substrate held on a spin chuck.

Second Embodiment

Now, a developing apparatus and a developing method in accordance with a second embodiment of the present disclosure will be described with reference to FIGS. 18 to 22B.

The developing apparatus in accordance with the second embodiment is different from the developing apparatus in accordance with the first embodiment in that a rinse solution is scattered while a position where vapor of a first processing solution is supplied by a vapor supply nozzle is being shifted from a periphery of a wafer toward a center of the wafer.

Figure 18:
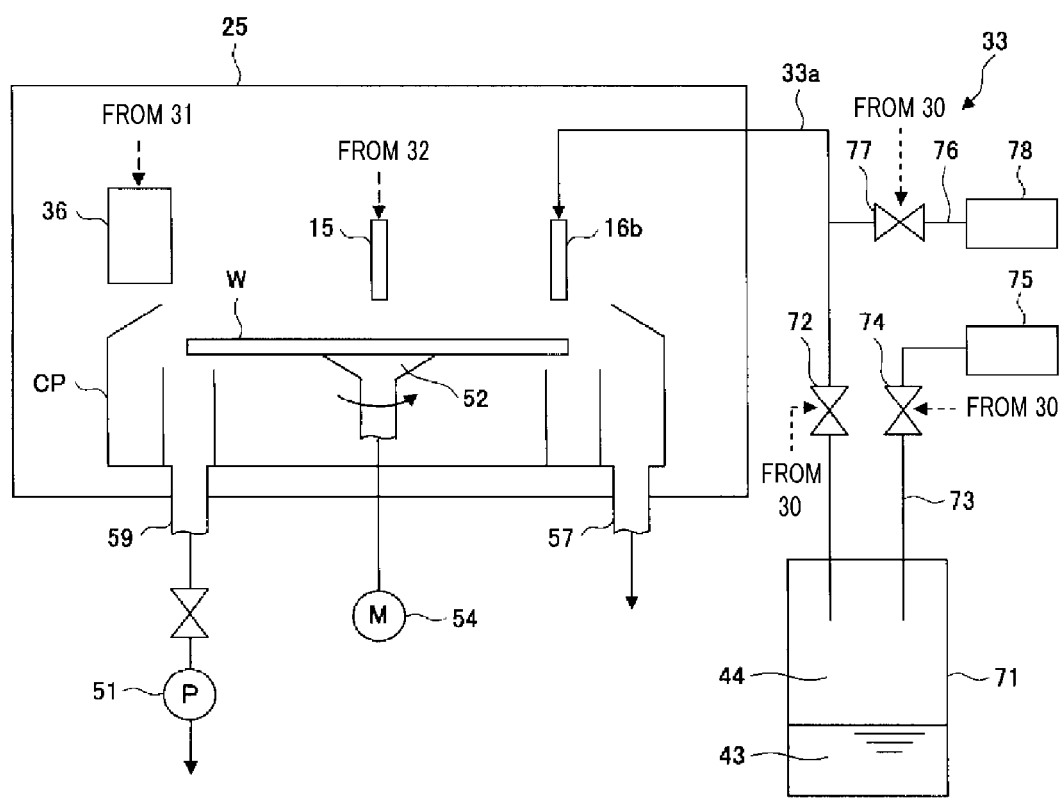
FIG. 18 is a schematic diagram illustrating major parts of a developing unit in accordance with a second embodiment of the present disclosure.
Figure 19:
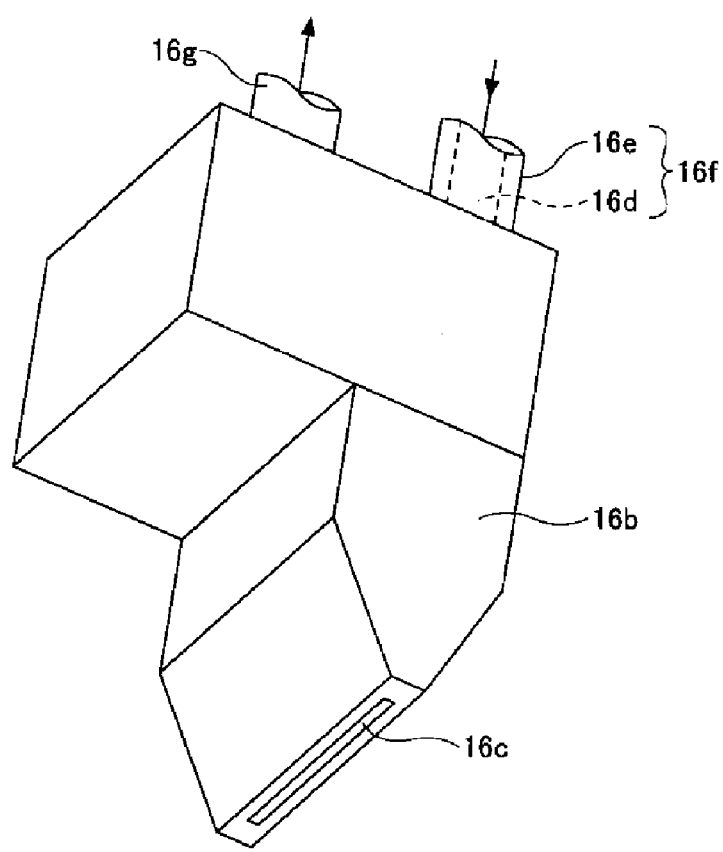
FIG. 19 is a perspective view illustrating an example vapor supply nozzle provided with a strip-shaped discharge opening.

FIG. 18 is a diagram schematically illustrating major parts of a developing unit in accordance with the second embodiment. FIG. 19 is a perspective view illustrating an example vapor supply nozzle provided with a strip-shaped discharge opening.

In this second embodiment, units other than a developing unit DEV of a coating and developing system may be substantially the same as those described in the first embodiment with reference to FIGS. 1 to 3. Further, the developing unit DEV in accordance with the second embodiment may have the same configuration as that of the developing unit DEV of the coating and developing system in accordance with the first embodiment. Thus, elaboration of parts in FIG. 18 already described in the first embodiment with reference to FIGS. 4 and 5 will be omitted.

FIG. 18 schematically illustrates nozzle positions when a rinse solution removing process is performed after a developing solution supply process and a rinse solution supply process are performed as will be described below with reference to FIG. 20. That is, a developing solution nozzle 36 is located outside a cup CP; a rinse nozzle 15 is located at a position above an approximate center of a wafer W; and a vapor supply nozzle 16b is located at a position above an approximate edge of the wafer W.

The vapor supply nozzle 16b is moved above the wafer W from the periphery of the wafer W toward the center of the wafer W in a spiral shape. The vapor supply nozzle 16b may have a strip-shaped discharge opening in a diametric direction of the wafer W. Below, an example vapor supply nozzle provided with a strip-shaped discharge opening will be explained with reference to FIG. 19.

As depicted in FIG. 19, the vapor supply nozzle 16b is formed in, e.g., a wedge shape such that its width decreases toward a bottom thereof, and a strip-shaped (slit-shaped) discharge opening 16c for supplying vapor 44 of the first processing solution is provided in a bottom surface of the vapor supply nozzle 16b. The discharge opening 16c is arranged such that its lengthwise direction is oriented toward the center of the wafer W from the periphery thereof.

Further, a temperature control may be performed by using a double pipe 16f including an inner pipe 16d and an outer pipe 16e so as to set a temperature of the vapor 44 of the first processing solution to be a preset value depending on the kind of the wafer W, a resist pattern and/or the rinse solution. Temperature-controlled hot water supplied from a non-illustrated hot water supply source flows through the outer pipe 6e, and the vapor 44 of the first processing solution supplied from a vapor supply mechanism 33 flows through the inner pipe 16d. Further, the temperature-controlled hot water is returned back into the hot water supply source through a return pipe 16g. The vapor supply nozzle 16d having the above-described configuration may be used in other embodiments or modification examples.

Now, a developing method in accordance with the second embodiment will be described with reference to FIGS. 20 to 22B. FIG. 20 provides a flowchart to describe a process sequence. FIGS. 21A to 21D are side views and FIGS. 22A and 22B are plane views for illustrating respective processes.

Figure 20:
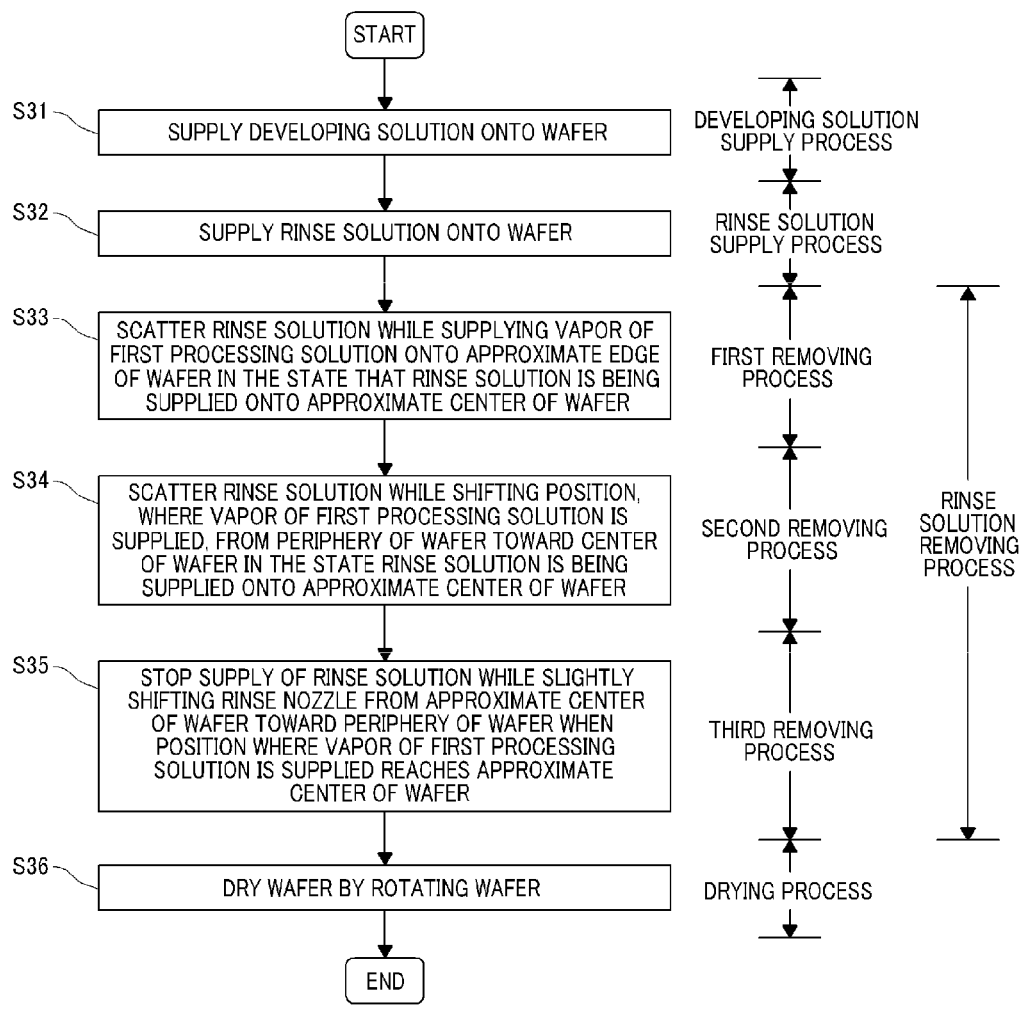
FIG. 20 is a flowchart for describing a process sequence of the developing method using the developing unit in accordance with the second embodiment.

As depicted in FIG. 20, the developing method in accordance with the second embodiment may include a developing solution supply process (step S31), a rinse solution supply process (step S32), a rinse solution removing process (steps S33 to S35) and a drying process (step S36). The rinse solution removing process may include a first removing process (step S33), a second removing process (step S34) and a third removing process (step S35).

First, the developing solution supply process (S31) and the rinse solution supply process (S32) are performed. The developing solution supply process (S31) and the rinse solution supply process (S32) may be carried out in the same ways as steps S11 and S12 in accordance with the first embodiment, respectively.

Then, the rinse solution removing process (steps S33 to S35) is performed. In this rinse solution removing process (steps S33 to S35), in the state that the rinse solution 42 is being supplied onto an approximate center of a wafer W, a rinse solution 42 is scattered while shifting a position, where the vapor 44 of the first processing solution is supplied to the wafer W, from a periphery of the wafer W toward the approximate center of the wafer W.

The first removing process (step S33) is performed first. In the first removing process (step S33), in the state that the rinse solution 42 is being supplied onto the approximate center of the wafer W, the wafer W is rotated while supplying the vapor 44 of the first processing solution onto an approximate edge of the wafer W, so that the rinse solution 42 is scattered away.

Figure 21A:
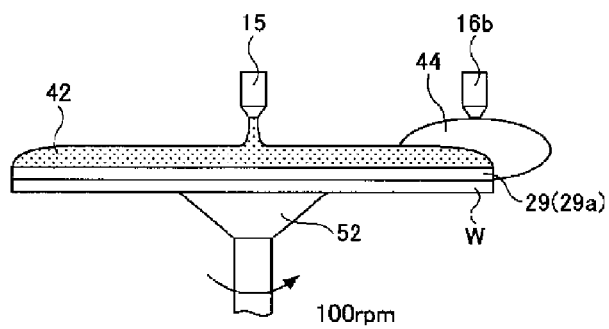
FIGS. 21A to 21D are side views for illustrating respective processes of the developing method using the developing unit in accordance with the second embodiment.
Figure 22A:
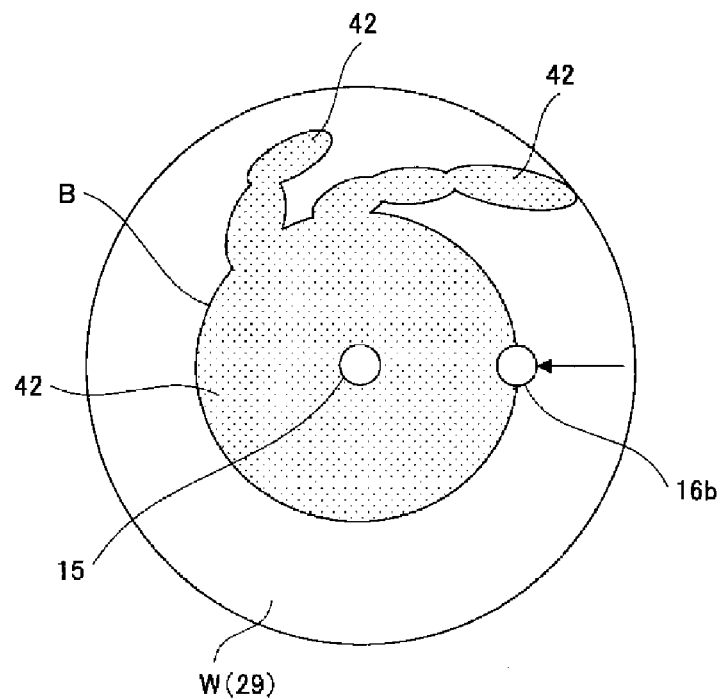
FIGS. 22A and 22B are plane views for illustrating respective processes of the developing method using the developing unit in accordance with the second embodiment.
Figure 22B:
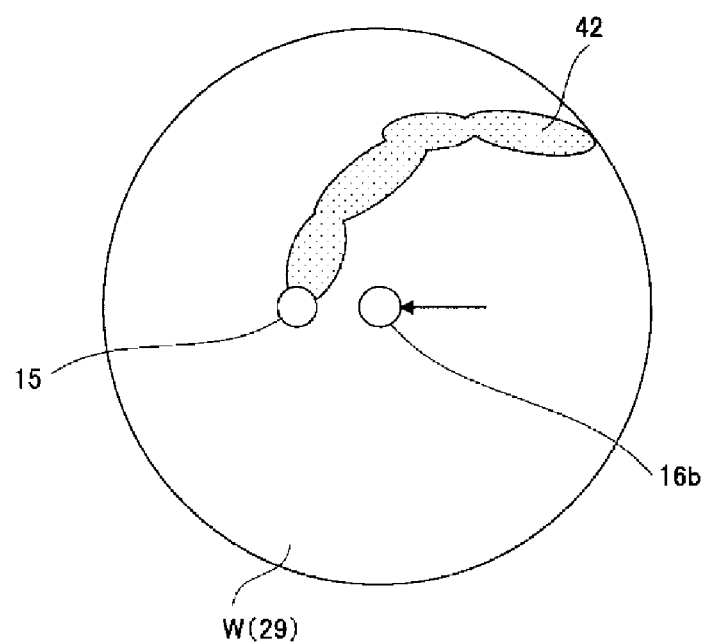

As illustrated in FIG. 21A, in the state that a rinse nozzle 15 above the approximate center of the wafer W is supplying the rinse solution 42 onto the wafer W, the wafer W is rotated by a driving motor 54 at a rotation speed of, e.g., about 0 rpm to about 200 rpm, desirably, about 100 rpm while the vapor supply nozzle 16b moved to an approximate edge of the wafer W is supplying the vapor 44 of the first processing solution to the edge of the wafer W.

Figure 21B:
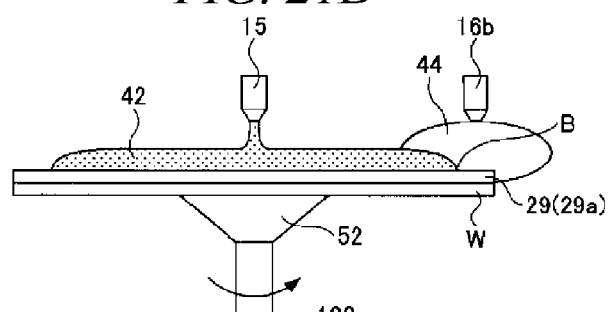

As illustrated in FIG. 21A, if the vapor 44 of the first processing solution 44 is supplied and a concentration, i.e., a pressure of the vapor 44 of the first processing solution 44 increases at the approximate edge of the wafer W, the rinse solution 42 may be moved to a center of the wafer W in which the concentration, i.e., the pressure of the vapor 44 of the first processing solution is low. As a result, a liquid film of the rinse solution may be recessed at the approximate edge of the wafer W, so that a thickness of the liquid film at the approximate edge of the wafer W would be reduced, whereas the thickness of the liquid film at the center portion of the wafer W would be increased. Then, if the vapor 44 of the first processing solution continues to be supplied, a part of the rinse solution 42 may be repelled on the approximate edge of the wafer W and a part of the surface of the wafer W may be exposed, so that an interface B between the rinse solution 42 and an atmosphere (vapor 44 of the first processing solution) may be formed on the surface of the wafer W, as illustrated in FIG. 21B. Further, the rinse solution 42 may be rotatably scattered from the exposed surface of the wafer W at the approximate edge thereof.

Further, in the present embodiment, if the concentration of the vapor 44 of the first processing solution increases on the wafer W, the vapor 44 of the first processing solution may be mixed with the rinse solution 42, resulting in reduction of a surface tension of the rinse solution 42. Moreover, if the concentration of the vapor 44 of the first processing solution increases on the wafer W, the vapor 44 of the first processing solution may be mixed with the rinse solution 42 and the mixture may reach the surface of the resist pattern 29 on the wafer W and may hydrophobicize the surface of the resist pattern 29.

In FIGS. 21A to 21D, the vapor 44 of the first processing solution supplied from the vapor supply nozzle 16b is shown to have a certain area for the purpose of illustration. Since, however, the vapor 44 of the first processing solution diffuses as a gas, there exists no clear boundary.

Subsequently, the second removing process (step S34) is performed. In the second removing process (step S34), in the state that the rinse solution 42 is being supplied onto the approximate center of the wafer W, the wafer W is rotated, while shifting a position, where the vapor 44 of the first processing solution is supplied to the wafer W, from the periphery of the wafer W toward the center of the wafer W. As a result, the rinse solution 42 is scattered away.

Figure 21C:
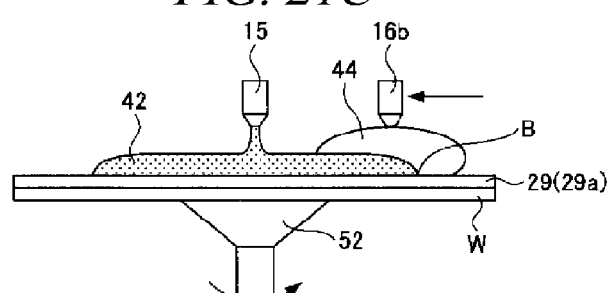

As illustrated in FIG. 21C, in the state that the rinse nozzle 15 above the approximate center of the wafer W is supplying the rinse solution 42 onto the wafer W and the vapor supply nozzle 16b is supplying the vapor 44 of the first processing solution onto the wafer W, the wafer W is rotated by the driving motor 54 at a rotation speed of, e.g., about 0 rpm to about 200 rpm, more desirably, about 100 rpm while the vapor supply nozzle 16b is moved toward the approximate center of the wafer W.

Further, in the second removing process (step 34), the rinse solution 42 may be rotatably scattered from the exposed surface of the wafer W at the approximate edge thereof as illustrated in FIG. 22A, as in the first removing process (step S33). The interface B between the rinse solution 42 and the atmosphere (vapor 44 of the first processing solution) is moved on the surface of the wafer W from the periphery of the wafer W toward the center of the wafer W to follow up the movement of the vapor supply nozzle 16b.

Then, the third removing process (step S55) is performed. In the third removing process (step S35), when the position where the vapor 44 of the first processing solution is supplied to the wafer W reaches the approximate center of the wafer W, the rinse solution 42 is scattered away by rotating the wafer W while slightly moving the rise nozzle 15 from the approximate center of the wafer W toward a periphery of the wafer W.

Figure 21D:
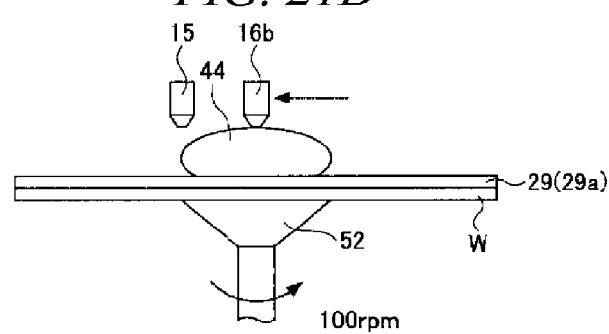

In other words, in the state that the vapor supply nozzle 16b is supplying the vapor 44 of the first processing solution, the rinse nozzle 15 is slightly moved from the approximate center of the wafer W toward the periphery of the wafer W when the vapor supply nozzle 16b reaches the approximate center of the wafer W, as illustrated in FIG. 21D. As a result, hydrophobicization of the surface of the resist pattern 29 may be completed on the entire surface of the wafer W, and the rinse solution 42 to be scattered as a result of the rotation of the wafer W may not be accumulated on the wafer W, but may be scattered off the wafer W while being rotated on the surface of the wafer W, as depicted in FIG. 22B.

Thereafter, the drying process (step S36) is performed. In the drying process (step S36), a drying process is performed by rotating the wafer W at a preset rotation speed, as in the drying process (step S17) in accordance with the first embodiment.

After the third removing process (step S35) is performed, the surface of the resist pattern 29 is hydrophobicized on the entire surface of the wafer W. Accordingly, a rinse solution supply process may be additionally performed between the third removing process (step S35) and the drying process (step S36). Even if the rinse solution is removed after the additional rinse solution supply process, pattern collapse can be prevented.

In the second embodiment, a moving speed of the vapor supply nozzle 16b that is moved from the edge of the wafer W toward the center of the wafer W is set so as to allow the discharge opening 16c to reach the approximate center of the wafer W in about 1 to about 5 seconds in case of the 12 inch wafer W, for example). Accordingly, by way of example, a rotation speed of the wafer W and the moving speed of the nozzle may be determined by, e.g., calculation or by previous experiment based on a length of the strip-shaped discharge opening 16c so as to allow the vapor 44 of the first processing solution to be discharged on the entire surface of the wafer W without missing parts in a radial direction thereof. At this time, the vapor 44 of the first processing solution discharged from the discharge opening 16c in a strip shape may be diffused on the entire surface of the wafer W without missing parts from an outer side toward an inner side thereof. As a result, a hydrophobicized part of the surface of the resist pattern 29 by the vapor 44 of the first processing solution may be expanded from the edge of the wafer W toward the center of the wafer W in a spiral shape on the entire surface of the wafer W.

In this second embodiment, the surface of the resist pattern may be hydrophobicized by the vapor of the first processing solution including a hydrophobicizing agent. Accordingly, pattern collapse can be suppressed when the rinse solution is supplied onto a substrate on which fine resist patterns are formed and then the rinse solution is removed from the substrate. Furthermore, by reducing an amount of usage of the hydrophobicizing agent, cost for substrate processing can be reduced.

Further, in the second embodiment, in the state that the rinse solution is being supplied onto the approximate center of the wafer W, the rinse solution is scattered and removed while shifting the position, where the vapor of the first processing solution is supplied to the wafer W, from the periphery of the wafer toward the center of the wafer. The interface between the rinse solution and the atmosphere is also automatically moved on the wafer W from the periphery of the wafer W toward the center of the wafer W to follow up the movement of the vapor supply nozzle, so that the interface between the rinse solution and the atmosphere may not be moved to the center of the wafer W ahead of the vapor supply nozzle. Accordingly, when the rinse solution is supplied onto the substrate on which fine resist patterns are formed and when the rinse solution is removed from this substrate, pattern collapse can be suppressed more securely.

Moreover, in the present embodiment, although it has been described that the present disclosure is applied to the developing apparatus, the present disclosure may not be limited to the developing apparatus but can be applied to a single-wafer cleaning apparatus that performs a cleaning process on a substrate held on a spin chuck. Furthermore, in the present embodiment, although it has been described that the present disclosure is applied to the developing method, the present disclosure may not be limited to the developing method but can be applied to a single-wafer cleaning method for performing a cleaning process on a substrate held on a spin chuck.

Third Embodiment

Now, referring to FIGS. 23 to 25, a developing apparatus and a developing method in accordance with a third embodiment will be described.

The developing apparatus in accordance with the third embodiment is different from the developing apparatus in accordance with the first embodiment in that it includes a nozzle unit having a vapor supply nozzle of an elongated shape and a suction nozzle at a front side in a moving direction of the nozzle unit.

Figure 23:
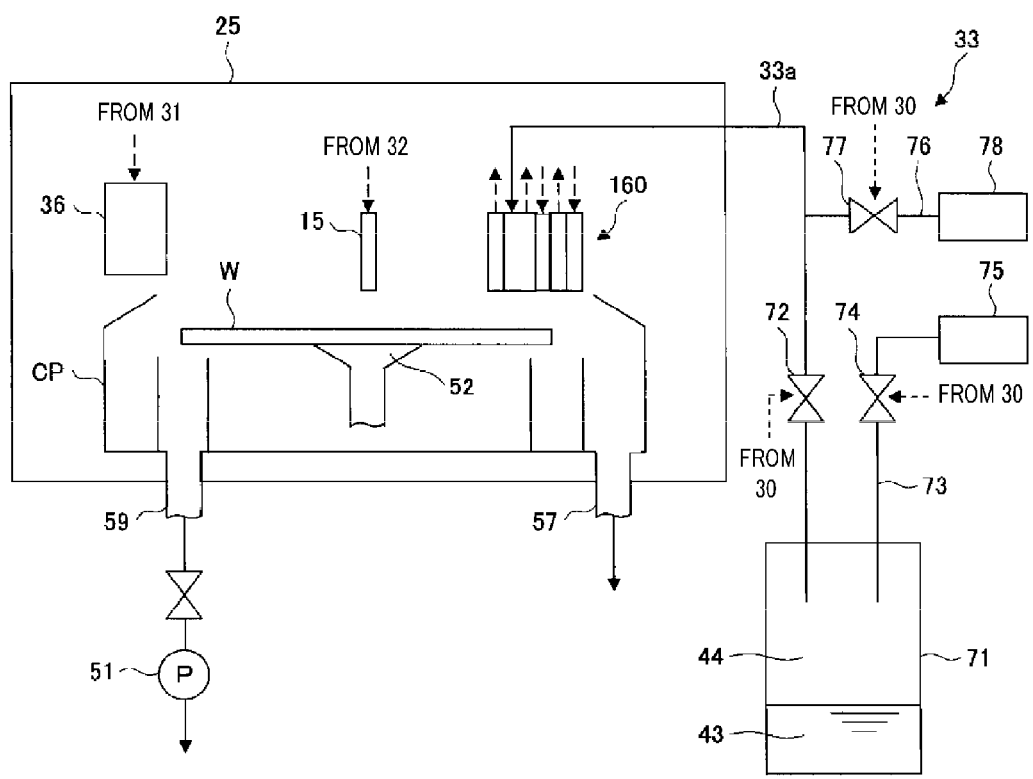
FIG. 23 is a schematic diagram illustrating major parts of a developing unit in accordance with a third embodiment of the present disclosure.
Figure 24A:
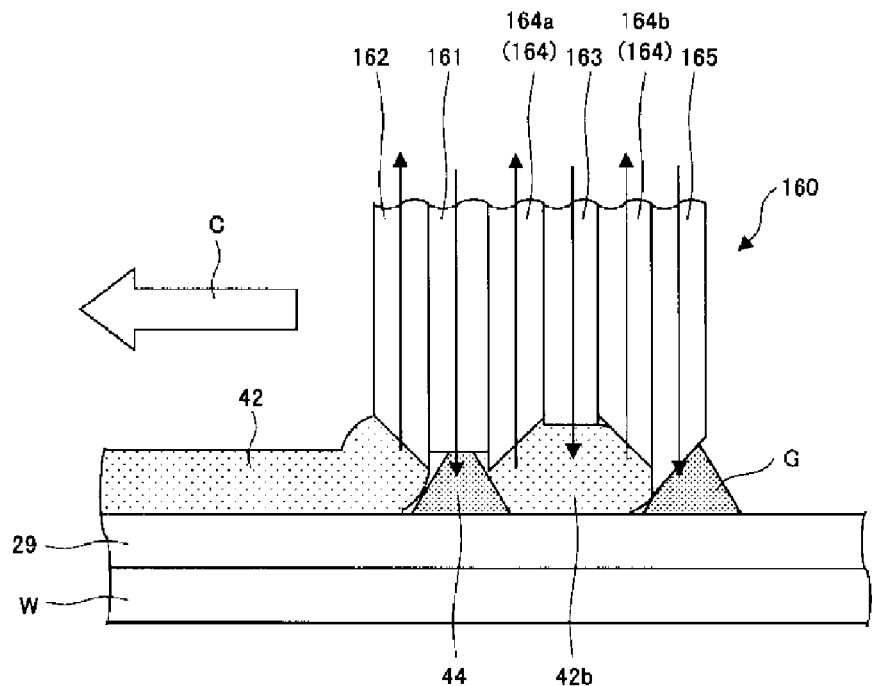
FIGS. 24A and 24B are enlarged views of a nozzle unit.
Figure 24B:
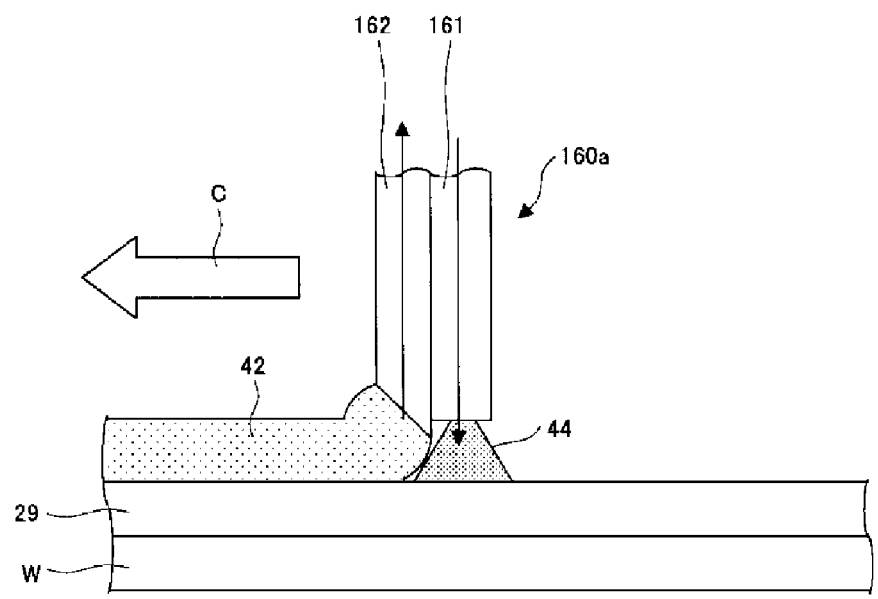

FIG. 23 is a diagram schematically illustrating major parts of a developing apparatus in accordance with the third embodiment. FIGS. 24A and 24B are enlarged views of the nozzle unit.

In the third embodiment, units other than a developing unit DEV of a coating and developing system including the developing apparatus may be the same as those described in the first embodiment with reference to FIGS. 1 to 3. Further, except the vicinities of the vapor supply nozzle, the developing unit DEV in accordance with the third embodiment may have the same configuration as that of the developing unit DEV of the coating and developing system in accordance with the first embodiment. Thus, elaboration of parts in FIG. 23 already described in the first embodiment with reference to FIGS. 4 and 5 will be omitted.

FIG. 23 schematically illustrates nozzle positions when a rinse solution removing process is performed after a developing solution supply process and a rinse solution removing process are performed as will be described below with reference to FIG. 25. That is, a developing solution nozzle 36 is located outside a cup CP; a rinse nozzle 15 is located at a position above an approximate center of a wafer W; and a nozzle unit 160 including a vapor supply nozzle is located at a position above an approximate edge of the wafer W.

As depicted in FIGS. 23 and 24A, the nozzle unit 160 includes a first discharge nozzle 161, a first suction nozzle 162, a second discharge nozzle 163, a second suction nozzle 164 and a third discharge nozzle 165. The nozzle unit 160 including the respective nozzles is configured to be movable above the wafer W in a direction C (hereinafter, referred to as a "moving direction"). Further, each of the nozzles may have an elongated shape having a length substantially the same as a diameter of the wafer W. The nozzles are arranged in a direction that intersects an elongated direction of the elongated nozzles. Furthermore, the nozzles may be configured to be movable all together in the direction (arrangement direction of each nozzle and direction substantially parallel with the diametric direction of the wafer W) that intersects the elongated direction of the nozzles. Alternatively, as long as a preceding and following relationship to be described below is satisfied, some of the nozzles may be move together, while the others are moved separately from them. Still alternatively, the nozzles may be configured to be movable all individually.

The first discharge nozzle 161 supplies vapor 44 of a first processing solution onto a wafer W. The first discharge nozzle 161 serves as a vapor supply unit in accordance with the present disclosure.

The first suction nozzle 162 is configured to be movable on the front side of the first discharge nozzle 161 in the moving direction C of the nozzle unit 160. The first suction nozzle 162 sucks in a rinse solution 42, and serves as a suction unit and a rinse solution removing unit in accordance with the present disclosure.

The second discharge nozzle 163 is configured to be movable on the rear side of the first discharge nozzle 161 in the moving direction C of the nozzle unit 160. The second discharge nozzle 163 supplies a second rinse solution 42b onto the wafer W from which the rinse solution 42 has been removed. The second suction nozzle 164 is configured to be movable on the rear side of the first discharge nozzle 161 in the moving direction C of the nozzle unit 160, and the second suction nozzle 164 sucks and removes the second rinse solution 42b supplied on the wafer W. In this third embodiment, the second suction nozzle 164 is divided into two nozzles 164a and 164b, and these two second suction nozzles 164a and 164b are respectively provided on the front side and on the rear side of the second discharge nozzle 163 in the moving direction C of the nozzle unit 160.

The third discharge nozzle 165 is configured to be movable on the rear side of the second discharge nozzle 163 and the second suction nozzle 164 in the moving direction C of the nozzle unit 160. The third discharge nozzle 165 supplies a gas G onto the wafer W from which the second rinse solution 42b has been removed and thus dries the wafer W.

In order to prevent pattern collapse and reduce an amount of usage of the first processing solution 43, the nozzle unit may have only the first discharge nozzle 161 and the first suction nozzle 162. That is, the nozzle unit may not include the second discharge nozzle, the second suction nozzle and the third discharge nozzle. FIG. 24B illustrates an example nozzle unit 160a having only a first discharge nozzle 161 and a first suction nozzle 162 without having a second discharge nozzle, a second suction nozzle and a third discharge nozzle.

Further, in this embodiment, a rinse nozzle 15 is provided separately from the nozzle unit 160. However, the rinse nozzle may be provided on a front side of all nozzles included in the nozzle unit in a direction in which the nozzle unit is moved above a wafer W. Accordingly, the rinse nozzle may be included in the nozzle unit. In such a case, the rinse nozzle may have an elongated shape having a length substantially the same as a diameter of the wafer W like the first discharge nozzle. A driving motor for rotating a spin chuck 52 may be omitted, as illustrated in FIG. 23.

Now, a developing method in accordance with the third embodiment will be explained with reference to FIGS. 24A and 25. FIG. 25 provides a flowchart to describe a process sequence.

Figure 25:
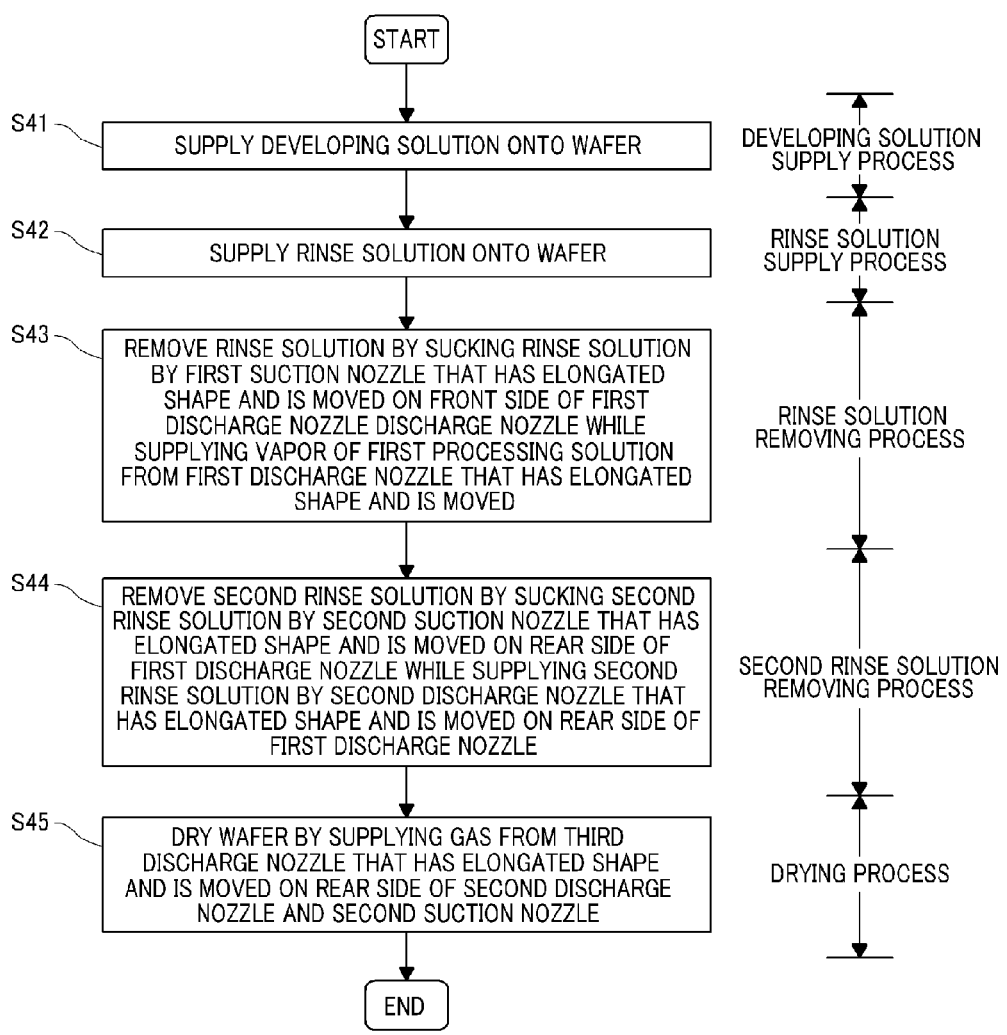
FIG. 25 is a flowchart for describing a process sequence of a developing method using the developing unit in accordance with the third embodiment.

As described in FIG. 25, the developing method in accordance with the third embodiment may include a developing solution supply process (step S41), a rinse solution supply process (step S42), a rinse solution removing process (step S43), a second rinse solution removing process (step S44) and a drying process (step S45).

In the aforementioned processes, the rinse solution removing process (step S43) to the drying process (step S45) are mentioned in sequence at positions on the wafer W. In accordance with the present embodiment, however, while the nozzle unit 160 is being moved above the wafer W from one side to the other, the processes are performed. The rinse solution removing process (step S43) to the drying process (step S45) may be performed at different positions on the wafer W simultaneously. Accordingly, the following description will be provided at the positions where the wafer W is located.

First, the developing solution supply process (step S41) and the rinse solution supply process (S42) are performed. The developing solution supply process (step S41) and the rinse solution supply process (step S42) may be performed in the same ways as the developing solution supply process (step S11) and the rinse solution supply process (step S12) in accordance with the first embodiment.

Then, the rinse solution removing process (step S43) is performed. In the rinse solution removing process (step S43), while supplying the vapor 44 of the first processing solution from the first elongated discharge nozzle 161 that is being moved, the rinse solution 42 is removed by sucking the rinse solution 42 by the first elongated suction nozzle 162 that is being moved on the front side of the first discharge nozzle 161. The rinse solution removing process (step S43) to the drying process (step S45) are performed without rotating the wafer W.

Further, the third embodiment is described for the case of sucking and removing the rinse solution while supplying the vapor of the first processing solution onto the wafer W. However, the rinse solution may be sucked in after the vapor of the first processing solution is supplied. In such a case, although the rinse solution may not be sucked in while the vapor of the first processing solution is being supplied, the rinse solution may be sucked in and removed under an atmosphere including the vapor of the first processing solution.

Subsequently, the second rinse solution removing process (step S44) is performed. In the second rinse solution removing process (step S44), while supplying the second rinse solution 42b such as pure water by the second elongated discharge nozzle 163 that is being moved on the rear side of the first discharge nozzle 161, the second rinse solution 42b is removed by sucking in the second rinse solution 42b by the second elongated suction nozzles 164a and 164b that is being moved on the rear side of the first discharge nozzle 151.

Thereafter, the drying process (step S45) is performed. In the drying process (step S45), a gas such as N$_2$ is supplied by the third elongated discharge nozzle 164 that is being moved on the rear side of the second discharge nozzle 163 and the second suction nozzle 164 to dry the wafer W.

In this third embodiment, the surface of the resist pattern may be hydrophobicized by the vapor of the first processing solution including a hydrophobicizing agent. Accordingly, pattern collapse can be suppressed when the rinse solution is supplied onto a substrate on which fine resist patterns are formed and then the rinse solution is removed from the substrate. Furthermore, by reducing an amount of usage of the hydrophobicizing agent, cost for substrate processing can be reduced.

Furthermore, in the third embodiment as described above, the rinse solution is removed by sucking in the rinse solution by the suction nozzle. Accordingly, even in the cases that a processing target object is not of a circular shape or a center of gravity of the processing target object is not located at the center thereof, a process can be performed without rotating a processing target object, and pattern collapse can be still prevented. Furthermore, by reducing an amount of usage of the hydrophobicizing agent, cost for substrate processing can be reduced.

Moreover, in the present embodiment, although it has been described that the present disclosure is applied to the developing apparatus, the present disclosure may not be limited to the developing apparatus but can be applied to a single-wafer cleaning apparatus that performs a cleaning process on a substrate held on a spin chuck. Furthermore, in the present embodiment, although it has been described that the present disclosure is applied to the developing method, the present disclosure may not be limited to the developing method but can be applied to a single-wafer cleaning method for performing a cleaning process on a substrate held on a spin chuck.

Fourth Embodiment

Now, a developing apparatus and a developing method in accordance with a fourth embodiment will be described with reference to FIGS. 26 to 28.

The developing apparatus in accordance with the fourth embodiment is different from the developing apparatus in accordance with the first embodiment in that a rinse solution is removed by rotating a substrate approximately in a half-turn and a nozzle unit including a discharge nozzle and a suction nozzle having elongated shapes is positioned to cross an approximate center of the substrate.

Figure 26:
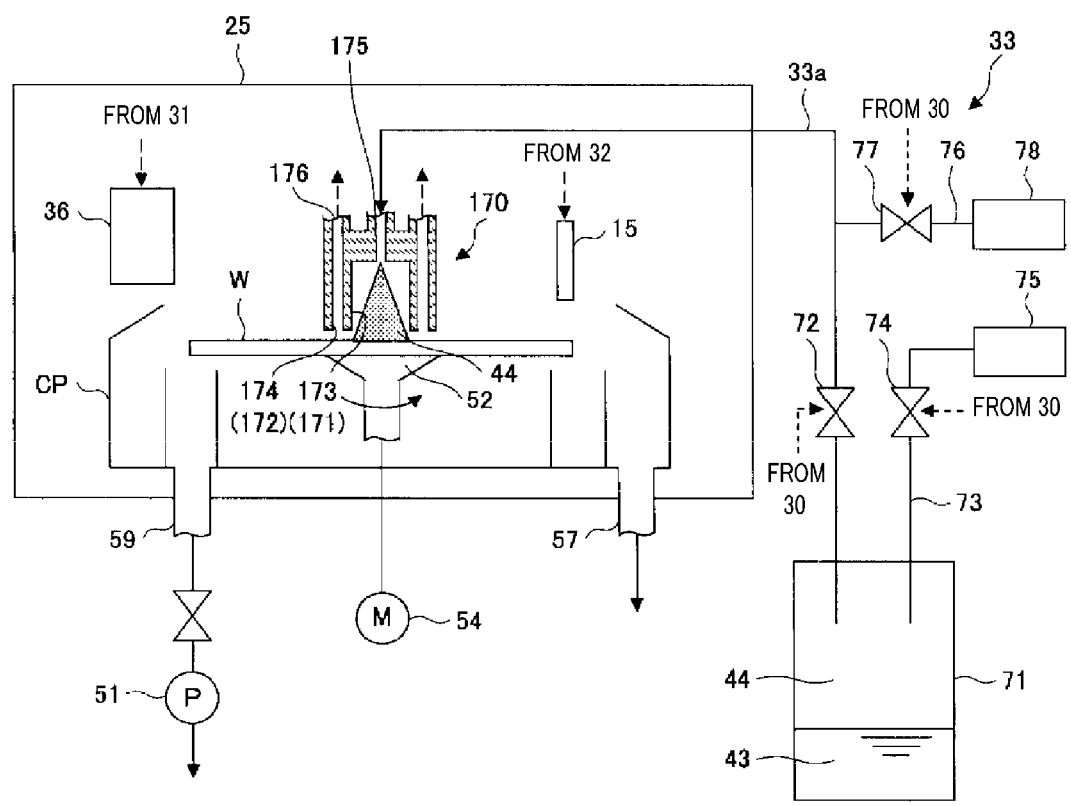
FIG. 26 is a schematic side view illustrating major parts of a developing unit in accordance with a fourth embodiment of the present disclosure.

FIG. 26 is a diagram schematically illustrating major parts of a developing unit in accordance with the fourth embodiment. FIG. 27 is a plane view schematically illustrating a vapor supply nozzle.

FIG. 26 schematically illustrates nozzle positions when a rinse solution removing process is performed after a developing solution supply process and a rinse solution supply process are performed as will be described below with reference to FIG. 28. That is, a developing solution nozzle 36 is located outside a cup CP; a rinse nozzle 15 is located at a position above an approximate edge of a wafer W; and a nozzle unit 170 including a discharge nozzle 171 is placed at a position above an approximate center of the wafer W.

Figure 27:
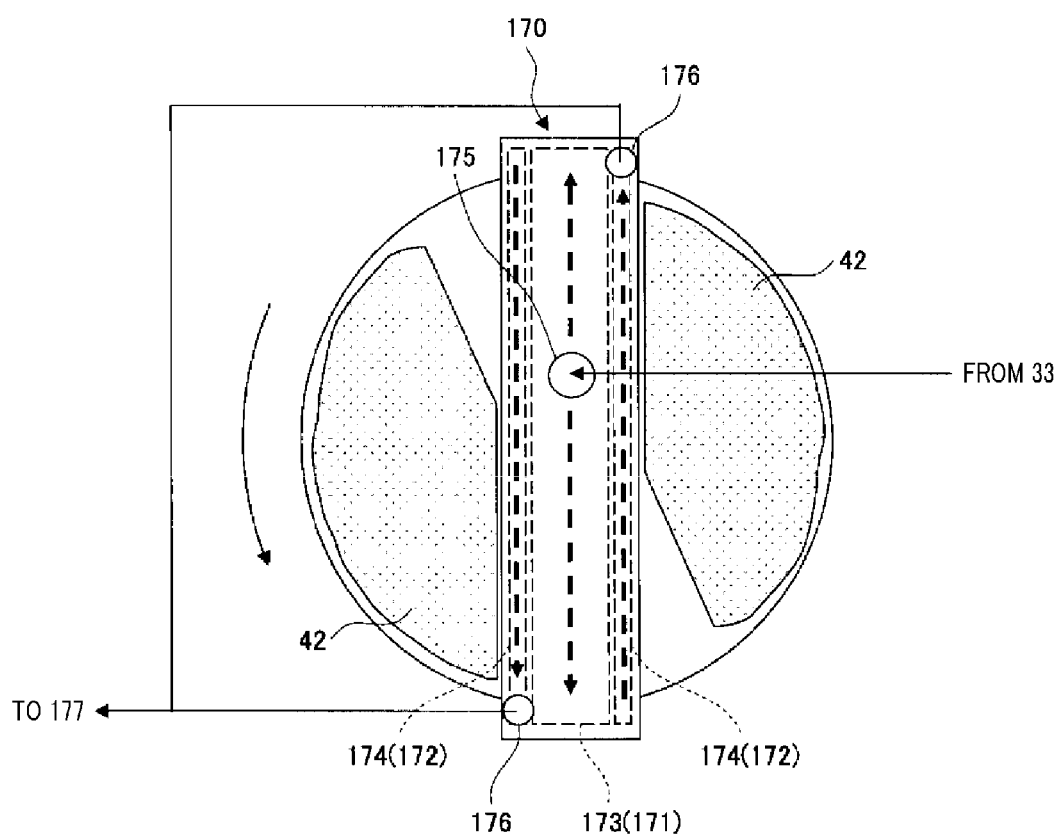
FIG. 27 is a plane view schematically illustrating a vapor supply nozzle.

As depicted in FIGS. 26 and 27, the nozzle unit 170 includes the discharge nozzle 171 and two suction nozzles 172. The discharge nozzle 171 is an elongated nozzle installed to cross an approximate center of the wafer W and provided with an elongated discharge opening 173 having a length substantially the same as a diameter of the wafer W. The discharge nozzle 171 serves as a vapor supply unit in accordance with the present disclosure.

As depicted in FIGS. 26 and 27, the two suction nozzles 172 are respectively installed on a front side and on a rear side of the discharge nozzle 171 in a direction that intersects an elongated direction of the discharge nozzle 171. Each suction nozzle 172 has an elongated shape and has a length substantially the same as that of the discharge nozzle 171. Further, each suction nozzle 172 is provided with an elongated suction opening 174 and sucks in and removes a rinse solution 42 supplied on the wafer W. The suction nozzles 172 serve as a suction unit and a rinse solution removing unit in accordance with the present disclosure.

A supply opening 175 for supplying vapor 44 of a first processing solution into the discharge nozzle 171 is provided above the discharge opening 173 of the discharge nozzle 171. The vapor 44 of the first processing solution supplied into the discharge opening 173 from a vapor supply mechanism 33 via the supply opening 175 is diffused to both sides of the discharge opening 173 in an elongated direction of the discharge opening 173. As depicted in FIG. 27, the supply opening 175 may not be provided at an approximate center of the wafer W but may be provided at a position slightly deviated from the approximate center of the wafer W toward a periphery of the wafer W in the elongated direction of the discharge opening 173. With this configuration, a surface of a resist pattern 29 can be uniformly hydrophobicized on the entire surface of the wafer W when the rinse solution 42 is removed by rotating the wafer W approximately in a half-turn.

An outlet opening 176 for draining the rinse solution from the suction nozzle 172 is provided at a position above the suction opening 174 of the suction nozzle 172. The rinse solution 42 sucked into the suction opening 174 may be collected in one place in the elongated direction of the suction opening 174 and may be drained through the outlet opening 176 by a drain unit 177. As depicted in FIG. 27, the outlet opening 176 may be provided at one end of the suction opening 174 in the elongated direction of the suction opening 174. To elaborate, as shown in FIG. 27, the outlet opening 176 may be provided at a position where the rinse solution 42 is sucked at the last when the wafer W is rotated substantially in a half-turn. With this configuration, the rinse solution 42 can be completely removed from the entire surface of the wafer W when the wafer W is rotated approximately in a half-turn.

Now, a developing method in accordance with the fourth embodiment will be described with reference to FIGS. 27 and 28. FIG. 28 provides a flowchart to describe a process sequence.

Figure 28:
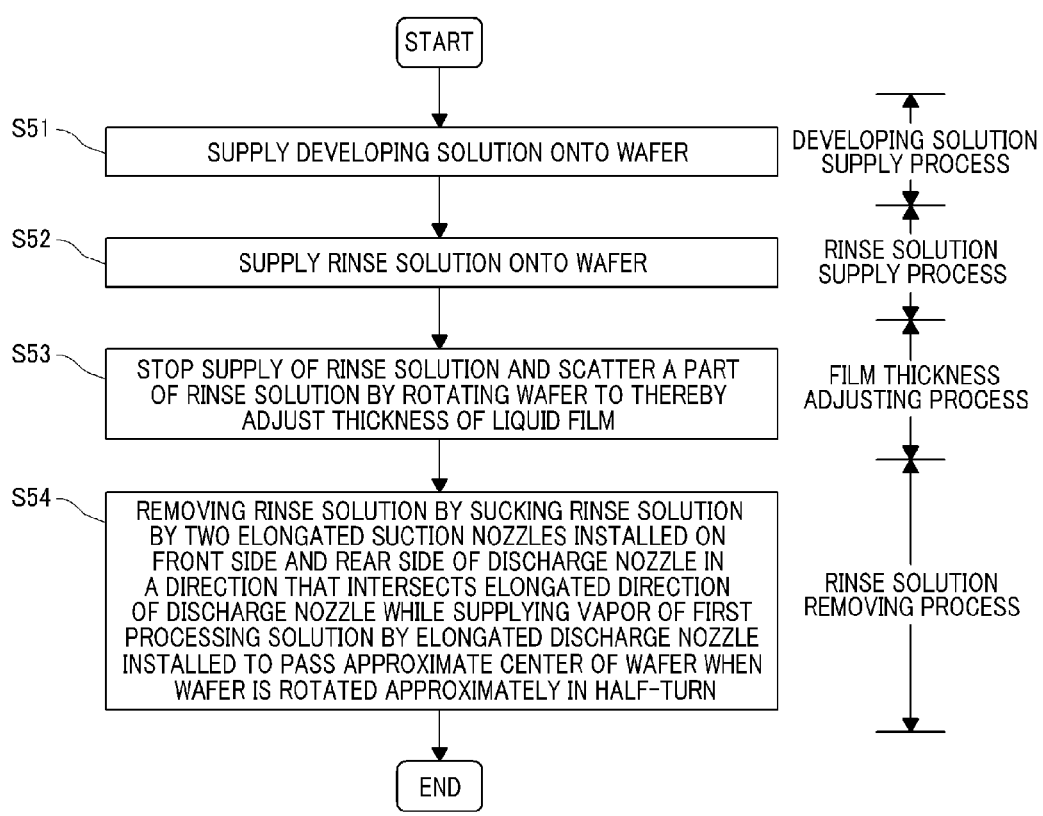
FIG. 28 is a flowchart for describing a process sequence of a developing method using the developing unit in accordance with the fourth embodiment.

As depicted in FIG. 28, the developing method in accordance with the fourth embodiment may include a developing solution supply process (step S51), a rinse solution supply process (step S52), a film thickness adjusting process (step S53) and a rinse solution removing process (step S54).

First, the developing solution supply process (step S51) to the film thickness adjusting process (step S53) are performed. The developing solution supply process (step S51) to the film thickness adjusting process (step S53) may be performed in the same ways as the developing solution supply process (step S11) to the film thickness adjusting process (step S13) in accordance with the first embodiment.

Then, the rinse solution removing process (step S54) is performed. In the rinse solution removing process (step S54), while supplying the vapor 44 of the first processing solution by the elongated discharge nozzle 171 installed to cross the approximate center of the wafer W when the wafer W is rotated approximately in a half-turn, the rinse solution 42 supplied on the wafer W is removed by sucking the rinse solution 42 by the two elongated suction nozzles 172 installed on the front side and on the rear side of the discharge nozzle 171 in the direction that intersects the elongated direction of the discharge nozzle 171.

As illustrated in FIG. 27, while supplying the vapor 44 of the first processing solution onto the wafer W by the discharge nozzle 171 and sucking in the rinse solution 42 from the wafer W by the suction nozzles 172, the wafer W is rotated by a driving motor 54 approximately in a half-turn at a low speed of, e.g., about 30 rpm. Accordingly, at positions where the wafer W is located, the rinse solution 42 can be removed by sucking the rinse solution 42 by the suction nozzles 172 immediately after the vapor 44 of the first processing solution is supplied by the discharge nozzle 171.

Further, the fourth embodiment has been described for the case of removing the rinse solution by rotating the wafer approximately in a half-turn. However, in case that four discharge nozzles having elongated shapes may be arranged crosswise and a suction nozzle is installed to surround the discharge nozzles, the rinse solution may be removed by rotating the wafer W approximately in a quarter-turn. Thus, by designing shapes of the discharge nozzle and the suction nozzle appropriately, the rinse solution can be removed by rotating the wafer by a certain angle.

In the fourth embodiment, the surface of the resist pattern may be hydrophobicized by the vapor of the first processing solution including a hydrophobicizing agent. Accordingly, pattern collapse can be suppressed when the rinse solution is supplied onto a substrate on which fine resist patterns are formed and then the rinse solution is removed from the substrate. Furthermore, by reducing an amount of usage of the hydrophobicizing agent, cost for substrate processing can be reduced.

Furthermore, in the fourth embodiment as described above, the rinse solution is removed by sucking the rinse solution by the suction nozzle. Accordingly, when it is necessary to perform a process without rotating a processing target object, pattern collapse can be still prevented. Furthermore, by reducing an amount of usage of the hydrophobicizing agent, cost for substrate processing can be reduced.

Moreover, in the present embodiment, although it has been described that the present disclosure is applied to the developing apparatus, the present disclosure may not be limited to the developing apparatus but can be applied to a single-wafer cleaning apparatus that performs a cleaning process on a substrate held on a spin chuck. Furthermore, in the present embodiment, although it has been described that the present disclosure is applied to the developing method, the present disclosure may not be limited to the developing method but can be applied to a single-wafer cleaning method for performing a cleaning process on a substrate held on a spin chuck.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A substrate processing method, comprising:
supplying a rinse solution onto a substrate on which a resist pattern is formed; and
removing the rinse solution from the substrate in an atmosphere including vapor of a first processing solution that hydrophobicizes the resist pattern,
wherein in the step of removing, an interface between the rinse solution and the vapor of the first processing solution is formed on a surface of the substrate by supplying the vapor of the first processing solution on a center portion of the substrate, and
when the interface is moved from the center portion of the substrate to a peripheral portion of the substrate by rotating the substrate, a vapor supply nozzle supplying the vapor of the first processing solution is also moved from the center portion of the substrate toward the peripheral portion of the substrate along with movement of the interface.

2. The substrate processing method of claim 1, wherein in the step of removing, the rinse solution is removed while moving the vapor supply nozzle at a speed corresponding to a speed at which the rinse solution is scattered and moved.

3. The substrate processing method of claim 1, wherein the step of removing includes:

irradiating a light to a surface of the substrate; and detecting the light reflected from the surface of the substrate;

wherein, in the step of removing, the rinse solution is removed while moving the vapor supply nozzle based on an amount of the reflected light.

4. The substrate processing method of claim 1, further comprising:

between the step of supplying and the step of removing, supplying a second processing solution having a smaller surface tension than that of the rinse solution onto the substrate, wherein the second processing solution is removed with removal of the rinse solution.

5. A substrate processing method, comprising:

supplying a rinse solution onto a substrate on which a resist pattern is formed; and removing the rinse solution from the substrate in an atmosphere including vapor of a first processing solution that hydrophobicizes the resist pattern, wherein, in the step of removing, the rinse solution is removed by rotating the substrate in a state that the rinse solution is being supplied onto a center portion of the substrate while moving a vapor supply nozzle supplying the vapor of the first processing solution from a peripheral portion of the substrate toward the center portion of the substrate, and wherein an interface between the rinse solution and the vapor of the first processing solution is formed on a surface of the substrate by supplying the vapor of the first processing solution, and then the interface is moved from the peripheral portion of the substrate toward the center portion of the substrate along with movement of the vapor supply nozzle.

6. A non-transitory computer readable storage medium that stores therein a computer readable program that when executed by a computer causes the computer to cause an apparatus to perform the substrate processing method as claimed in claim 1.

* * * * *

UNITED STATES PATENT AND TRADEMARK OFFICE
CERTIFICATE OF CORRECTION

| | | |
|---|---|---|
| PATENT NO. | : 8,728,247 B2 | Page 1 of 1 |
| APPLICATION NO. | : 12/974092 | |
| DATED | : May 20, 2014 | |
| INVENTOR(S) | : Yuichiro Inatomi | |

It is certified that error appears in the above-identified patent and that said Letters Patent is hereby corrected as shown below:

In the Specification

Column 8, line 3, please add - 66 - between "64," and "and"

Column 13, line 6, please add - 44 - between "vapor" and "of"

Column 14, line 22, please add - 42 - between "solution" and "and"

Column 19, line 60, please add - 82 - between "plate" and "reflects"

Signed and Sealed this
Ninth Day of September, 2014

Michelle K. Lee
*Deputy Director of the United States Patent and Trademark Office*